US00RE37846E

(19) United States
(12) Reissued Patent
Matsuzawa et al.

(10) Patent Number: US RE37,846 E
(45) **Date of Reissued Patent: *Sep. 17, 2002**

(54) PROJECTION OPTICAL SYSTEM AND EXPOSURE APPARATUS USING THE SAME

(75) Inventors: Hitoshi Matsuzawa; Misako Kobayashi, both of Tokyo; Kazumasa Endo, Kawasaki; Yutaka Suenaga, Yokohama, all of (JP)

(73) Assignee: Nikon Corporation, Tokyo (JP)

( * ) Notice: This patent is subject to a terminal disclaimer.

(21) Appl. No.: 09/709,518

(22) Filed: Nov. 13, 2000

Related U.S. Patent Documents

Reissue of:
(64) Patent No.: 5,835,285
Issued: Nov. 10, 1998
Appl. No.: 08/882,802
Filed: Jun. 30, 1997

U.S. Applications:

(63) Continuation of application No. 08/516,903, filed on Aug. 18, 1995, now abandoned.

(30) Foreign Application Priority Data

Jan. 6, 1995 (JP) ..... 7-000872

(51) Int. Cl.[7] ..... G02B 9/64; G03C 5/00
(52) U.S. Cl. ..... 359/754; 359/649; 430/311
(58) Field of Search ..... 359/649, 650, 359/651, 754–756; 430/311

(56) References Cited

U.S. PATENT DOCUMENTS

| | | | |
|---|---|---|---|
| 3,504,961 | A | 4/1970 | Hoogland et al. |
| 3,737,215 | A | 6/1973 | De Jager |
| 3,897,138 | A | 7/1975 | Kano |
| 3,909,115 | A | 9/1975 | Kano |
| 3,955,883 | A | 5/1976 | Sugiyama |
| 4,080,048 | A | 3/1978 | Kimura |

(List continued on next page.)

FOREIGN PATENT DOCUMENTS

| | | | |
|---|---|---|---|
| DE | 19726058 | A | 1/1998 |
| EP | 0712019 | | 5/1996 |
| EP | 0717299 | | 6/1996 |
| EP | 0736789 | A | 10/1996 |
| EP | 0770895 | | 5/1997 |

(List continued on next page.)

OTHER PUBLICATIONS

Patent Abstracts of Japan, vol. 7, No. 73 (P–186) and JP–580 041 112, Jan. 11, 1983.*
Patent Abstracts of Japan, vol. 12, No. 366 (P–765) and JP–631 118 115, May 23, 1988.*
Patent Abstracts of Japan, vol. 17, No. 586 (P–1633) and JP–517 3065, Jul. 13, 1993.*

(List continued on next page.)

*Primary Examiner*—Scott J. Sugarman

(57) ABSTRACT

The present invention relates to an exposure apparatus using a projection optical system to realize a small size and the bitelecentricity as securing a wide exposure area and a large numerical aperture and to realize extremely good correction for aberrations, particularly for distortion. The projection optical system comprises a first lens group $G_1$ with a positive refracting power, a second lens group $G_2$ with a negative refracting power, a third lens group $G_3$ with a positive refracting power, a fourth lens group $G_4$ with a negative refracting power, a fifth lens group $G_5$ with a positive refracting power, and a sixth lens group $G_6$ with a positive refracting power in order from the side of the first object R, wherein the second lens group $G_2$ comprises a front lens $L_{2F}$ with a negative refracting power, a rear lens $L_{2R}$ of a negative meniscus shape, and an intermediate lens group $G_{2M}$ disposed between the front lens and the rear lens, and wherein the intermediate lens group $G_{2M}$ has a first lens $L_{M1}$ with a positive refracting power, a second lens $L_{M2}$ with a negative refracting power, and a third lens $L_{M3}$ with a negative refracting power in order from the side of the first object R. The system is arranged to satisfy within suitable ranges of focal lengths for the first to sixth lens groups $G_1$–$G_6$, based on the above arrangement.

90 Claims, 10 Drawing Sheets

U.S. PATENT DOCUMENTS

| | | | | | |
|---|---|---|---|---|---|
| 4,386,828 | A | | 6/1983 | Hirose | |
| 4,497,015 | A | | 1/1985 | Konno et al. | |
| 4,592,625 | A | | 6/1986 | Uehara et al. | |
| 4,666,273 | A | | 5/1987 | Shimizu et al. | |
| 4,685,777 | A | | 8/1987 | Hirose | |
| 4,701,035 | A | | 10/1987 | Hirose | |
| 4,770,477 | A | | 9/1988 | Shafer | |
| 4,772,107 | A | * | 9/1988 | Friedman | 359/754 |
| 4,779,966 | A | | 10/1988 | Friedman | |
| 4,811,055 | A | * | 3/1989 | Hirose | 355/53 |
| 4,812,028 | A | | 3/1989 | Matsumoto | |
| 4,851,978 | A | | 7/1989 | Ichihara | |
| 4,891,663 | A | * | 1/1990 | Hirose | 355/53 |
| 4,953,960 | A | | 9/1990 | Williamson | |
| 4,974,919 | A | | 12/1990 | Muraki et al. | |
| 4,977,426 | A | * | 12/1990 | Hirose | 355/53 |
| 5,052,763 | A | | 10/1991 | Singh et al. | |
| 5,089,913 | A | | 2/1992 | Singh et al. | |
| 5,097,291 | A | * | 3/1992 | Suzuki | 355/53 |
| 5,105,075 | A | * | 4/1992 | Ohta et al. | 250/201.2 |
| 5,159,496 | A | * | 10/1992 | Kataoka | 359/754 |
| 5,170,207 | A | * | 12/1992 | Tezuka et al. | 355/53 |
| 5,172,275 | A | * | 12/1992 | De Jager | 359/754 |
| 5,194,893 | A | | 3/1993 | Nishi | |
| 5,212,593 | A | | 5/1993 | Williamson et al. | |
| 5,220,454 | A | | 6/1993 | Ichihara et al. | |
| 5,241,423 | A | | 8/1993 | Chiu et al. | |
| 5,245,384 | A | * | 9/1993 | Mori | 355/67 |
| 5,253,110 | A | | 10/1993 | Ichihara et al. | |
| 5,260,832 | A | | 11/1993 | Togino et al. | |
| 5,323,263 | A | | 6/1994 | Schoemakers | |
| 5,333,035 | A | | 7/1994 | Shiraishi | |
| 5,365,051 | A | | 11/1994 | Suzuki et al. | |
| 5,402,267 | A | | 3/1995 | Furter et al. | |
| 5,406,415 | A | | 4/1995 | Kelly | |
| 5,414,551 | A | | 5/1995 | Okazaki et al. | |
| 5,448,408 | A | | 9/1995 | Togino et al. | |
| 5,506,684 | A | | 4/1996 | Ota et al. | |
| 5,515,207 | A | | 5/1996 | Foo | |
| 5,534,970 | A | | 7/1996 | Nakashima et al. | |
| 5,537,260 | A | | 7/1996 | Williamson | |
| 5,583,696 | A | | 12/1996 | Takahashi | |
| 5,591,958 | A | | 1/1997 | Nishi et al. | |
| 5,592,329 | A | | 1/1997 | Ishiyama et al. | |
| 5,636,066 | A | | 6/1997 | Takahashi | |
| 5,668,673 | A | | 9/1997 | Suenaga et al. | |
| 5,689,377 | A | | 11/1997 | Takahashi | |
| 5,691,802 | A | | 11/1997 | Takahashi | |
| 5,694,241 | A | | 12/1997 | Ishiyama et al. | |
| 5,706,137 | A | | 1/1998 | Kelly | |
| 5,742,436 | A | | 4/1998 | Furter | |
| 5,808,805 | A | | 9/1998 | Takahashi | |
| 5,856,884 | A | * | 1/1999 | Mercado | 359/754 |

FOREIGN PATENT DOCUMENTS

| | | | |
|---|---|---|---|
| EP | 0243950 | | 11/1997 |
| JP | 47-35017 | | 9/1972 |
| JP | 55-12902 | * | 1/1980 |
| JP | 58-04112 | | 1/1983 |
| JP | 58-078115 | | 5/1983 |
| JP | 61-156737 | | 7/1986 |
| JP | 63-118115 | | 5/1988 |
| JP | 63-163319 | | 7/1988 |
| JP | 2-66510 | | 3/1990 |
| JP | 3-282527 | | 12/1991 |
| JP | 4-42208 | | 2/1992 |
| JP | 4-157412 | | 5/1992 |
| JP | 4-234722 | | 8/1992 |
| JP | 5-72478 | | 3/1993 |
| JP | 05-173065 | | 7/1993 |
| JP | 5-173065 | | 7/1993 |
| JP | 6-313845 | | 11/1994 |
| JP | 07140384 | | 6/1995 |
| JP | 07140385 | | 6/1995 |
| WO | 93/04391 | | 3/1993 |

OTHER PUBLICATIONS

J. Braat, "Quality of Microlithographic Projection Lenses", pp. 22–30, Proceedings of SPIE vol. 811, Optical Microlithographic Technology for Integrated Circuit Fabrication and Inspection (1987).*

Japanese Publication No. 64–019317 (Jan. 1989) (Abstract only).

Japanese Publication No. 55–012902 (Jan. 29, 1980)(Abstract Only).

U.S. patent application Ser. No. 09/659,376, filed Sep. 8, 2000, Sasaya et al.

U.S. patent application Ser. No. 09/764,157, filed Jan. 19, 2001, Takahashi.

U.S. patent application Ser. No. 09/766,157, filed Jan. 19, 2001, Takahashi.

U.S. patent application Ser. No. 09/665,184, filed Sep. 5, 2000, Takahashi.

U.S. patent application Ser. No. 09/659,375, filed Sep. 8, 2000, Takahashi.

* cited by examiner

NA=0.57
-0.002
+0.002
SPHERICAL ABERRATION

Y=15.6
-0.002
+0.002
ASTIGMATISM

Y=15.6
-0.01
+0.01
DISTORTION (%)

Y=15.6
+0.005
-0.005
Y=10.92
+0.005
-0.005
Y=0
+0.005
-0.005
COMA

NA=0.57
-0.002
+0.002
SPHERICAL ABERRATION

Y=15.6
-0.002
+0.002
ASTIGMATISM

Y=15.6
-0.01
+0.01
DISTORTION (%)

Y=15.6
+0.005
-0.005
Y=10.92
+0.005
-0.005
Y=0
+0.005
-0.005
COMA

NA=0.57
-0.002
+0.002
SPHERICAL ABERRATION

Y=15.6
-0.002
+0.002
ASTIGMATISM

Y=15.6
-0.01
+0.01
DISTORTION (%)

Y=15.6
+0.005
-0.005
Y=10.92
+0.005
-0.005
Y=0
+0.005
-0.005
COMA

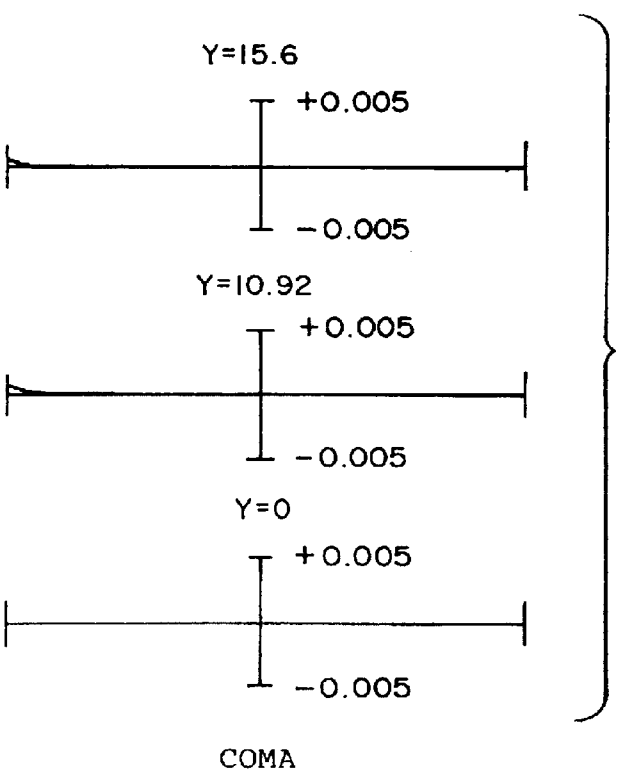
Fig. 22
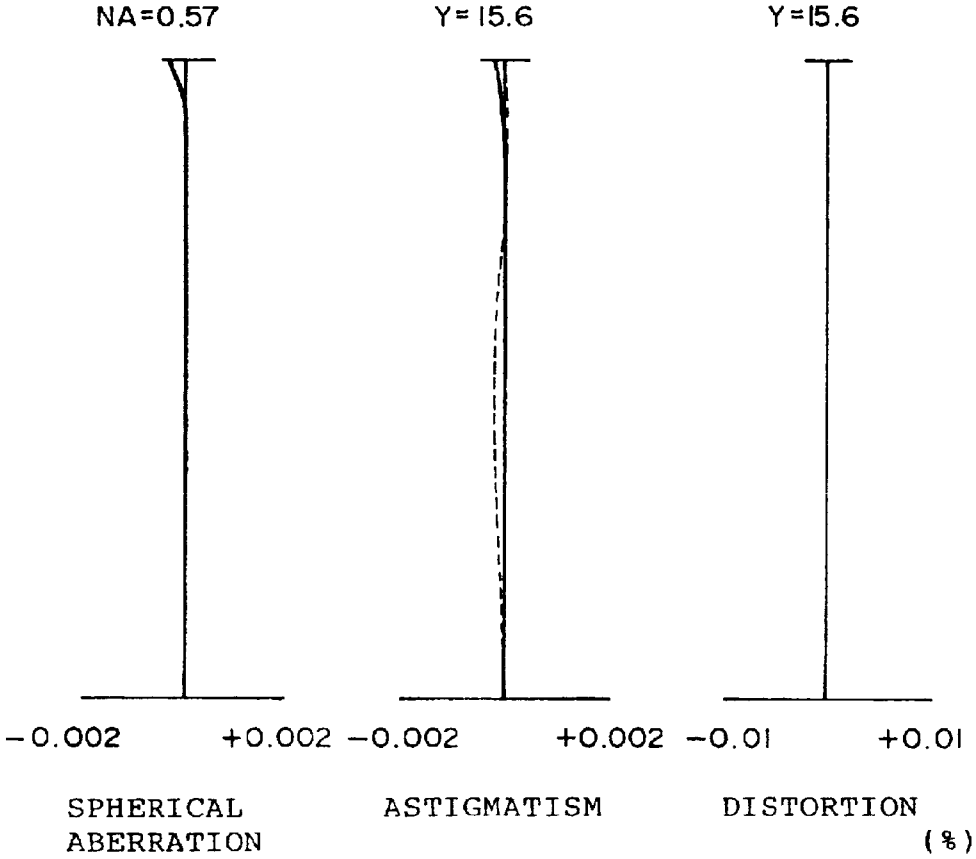
Fig. 21
Fig. 20
Fig. 19

PROJECTION OPTICAL SYSTEM AND EXPOSURE APPARATUS USING THE SAME

Matter enclosed in heavy brackets [ ] appears in the original patent but forms no part of this reissue specification; matter printed in italics indicates the additions made by reissue.

This is a continuation of application Ser. No. 08/516,903, filed Aug. 18, 1995, now abandoned.

BACKGROUND OF THE INVENTION

1. Field of the Invention

The present invention relates to an exposure apparatus having a projection optical system for projecting a pattern of a first object onto a photosensitive substrate etc. as a second object, and more particularly to a projection optical system suitably applicable to projection exposure of a pattern for semiconductor or liquid crystal formed on a reticle (mask) as the first object onto the substrate (semiconductor wafer, plate, etc.) as the second object.

2. Related Background Art

As the patterns of integrated circuits become finer and finer, the resolving power required for the exposure apparatus used in printing of wafer also becomes higher and higher. In addition to the improvement in resolving power, the projection optical systems of the exposure apparatus are required to decrease image stress. In order to get ready for the finer tendency of transfer patterns, light sources for exposure have recently been changing from those emitting the light of exposure wavelength of the g-line (436 nm) to those emitting the light of exposure wavelength of the i-line (365 nm) that are mainly used at present. Further, a trend is to use light sources emitting shorter wavelengths, for example the excimer laser (KrF:248 nm, ArF:193 nm).

Here, the image stress includes those due to bowing etc. of the printed wafer on the image side of projection optical system and those due to bowing etc. of the reticle with circuit pattern etc. written therein, on the object side of projection optical system, as well as distortion caused by the projection optical system.

With a recent further progress of fineness tendency of transfer patterns, demands to decrease the image stress are also becoming harder.

Then, in order to decrease effects of the wafer bowing on the image stress, the conventional technology has employed the so-called image-side telecentric optical system that located the exit pupil position at a farther point on the image side of projection optical system.

On the other hand, the image stress due to the bowing of reticle can also be reduced by employing a so-called object-side telecentric optical system that locates the entrance pupil position of projection optical system at a farther point from the object plane, and there are suggestions to locate the entrance pupil position of projection optical system at a relatively far position from the object plane as described. Examples of those suggestions are described for example in Japanese Laid-open Patent Applications No. 63-118115 and No. 5-173065 and U.S. Pat. No. 5,260,832.

SUMMARY OF THE INVENTION

An object of the present invention is to provide a high-performance projection optical system which can achieve the bitelecentricity in a compact design as securing a wide exposure area and a large numerical aperture and which can be well corrected for aberrations, particularly which can be very well corrected for distortion. The projection optical system can be applied to an exposure apparatus.

To achieve the above object, an exposure apparatus according to the present invention comprises at least a wafer stage allowing a photosensitive substrate to be held on a main surface thereof, an illumination optical system for emitting exposure light of a predetermined wavelength and transferring a predetermined pattern of a mask (reticle) onto the substrate, a projection optical system provided between a first surface on which the mask as a first object is disposed and a second surface on which a surface of the substrate as a second object is corresponded, for projecting an image of the pattern of the mask onto the substrate. The illumination optical system includes as alignment optical system for adjusting a relative positions between the mask and the wafer, and the mask is disposed on a reticle stage which is movable in parallel with respect to the main surface of the wafer stage. The projection optical system has a space permitting an aperture stop to be set therein. The photosensitive substrate comprises a wafer such as a silicon wafer or a glass plate, etc., and a photosensitive material such as a photoresist or the like coating a surface of the wafer. In particular, as shown in FIG. 1, the projection optical system includes a first lens group ($G_1$) with a positive refracting power, a second lens group ($G_2$) with a negative refracting power, a third lens group ($G_3$) with a positive refracting power, a fourth lens group ($G_4$) with a negative refracting power, a fifth lens group ($G_5$) with a positive refracting power, and a sixth lens group ($G_6$) with a positive refracting power in order from the side of the first object (for example, a mask).

The second lens group ($G_2$) comprises a front lens ($L_{2F}$) with a negative refracting power disposed as closest to the first object and shaded with a concave surface to the second object, a rear lens ($L_{2R}$) of a negative meniscus shape disposed as closest to the substrate and shaped with a concave surface to the mask, and an intermediate lens group ($G_{2M}$) disposed between the front lens ($L_{2F}$) and the rear lens ($L_{2R}$). In particular, the intermediate lens group ($G_{2M}$) has a first lens ($L_{M1}$) with a positive refracting power, a second lens ($L_{M2}$) with a negative refracting power, and a third lens ($L_{M3}$) with a negative refracting power in order from the side of the first object.

Further, the projection optical system according to the present invention is arranged to satisfy the following conditions (1) to (6) when $f_1$ is a focal length of the first lens group ($G_1$), $f_2$ is a focal length of the second lens group ($G_2$), $f_3$ is a focal length of the third lens group ($G_3$), $f_4$ is a focal length of the fourth lens group ($G_4$), $f_5$ is a focal length of the fifth lens group ($G_5$), $f_6$ is a focal length of the sixth lens group ($G_6$), and L is a distance from the first object to the second object:

(1) $f_1/L<0.8$ (2) $-0.033<f_2/L$ (3) $0.01<f_3/L<1.0$ (4) $f_4/L<-0.005$ (5) $0.01<f_5/L<0.9$ (6) $0.02<f_6/L<1.6$.

The projection optical system is so arranged as to have at least the first lens group ($G_1$) with positive refracting power, the second lens group ($G_2$) with negative refracting power, the third lens group ($G_3$) with positive refracting power, the fourth lens group ($G_4$) with negative refracting power, the fifth lens group ($G_5$) with positive refracting power, and the sixth lens group ($G_6$) with positive refracting power in the named order from the first object side.

First, the first lens group ($G_1$) with positive refracting power contributes mainly to a correction of distortion while maintaining telecentricity, and specifically, the first lens group ($G_1$) is arranged to generate a positive distortion to correct in a good balance negative distortions caused by the plurality of lens groups located on the second object side after the first lens group ($G_1$). The second lens group ($G_2$) with negative refracting power and the fourth lens group ($G_4$) with negative refracting power contribute mainly to a correction of Petzval sum to make the image plane flat. The two lens groups of the second lens group ($G_2$) with negative refracting power and the third lens group ($G_3$) with positive refracting power form an inverse telescopic system to contribute to guarantee of back focus (a distance from an optical surface such as a lens surface closest to the second object in the projection optical system to the second object) in the projection optical system. The fifth lens group ($G_5$) with positive refracting power and the sixth lens group ($G_6$) similarly with positive refracting power contribute mainly to suppressing generation of distortion and suppressing generation particularly of spherical aberration as much as possible in order to fully support high NA structure on the second object side.

Based on the above arrangement, the front lens ($L_{2F}$) with the negative refracting power disposed as closest to the first object in the second lens group ($G_2$) and shaped with the concave surface to the second object contributes to correction for curvature of field and coma, and the rear lens ($L_{2R}$) of the negative meniscus shape disposed as closest to the second object in the second lens group ($G_2$) and shaped with the concave surface to the first object contributes mainly to correction for coma. The rear lens ($L_{2R}$) also contributes to correction for curvature of field. Further, in the intermediate lens group ($G_{2M}$) disposed between the front lens ($L_{2F}$) and the rear lens ($L_{2R}$), the first lens ($L_{M1}$) with the positive refracting power contributes to correction for negative distortion generated by the second lens ($L_{M2}$) and third lens ($L_{M3}$) of the negative refracting powers greatly contributing to correction for curvature of field.

Condition (1) defines an optimum ratio between the focal length $f_1$ of the first lens group ($G_1$) with the positive refracting power and the distance (object-to-image distance) L from the first object (reticle etc.) to the second object (wafer etc.). This condition (1) is mainly for well-balanced correction for distortion.

Above the upper limit of condition (1), large negative distortion will appear. In order to achieve a compact design as securing a reduction magnification and a wide exposure area and to achieve good correction for distortion, the upper limit of condition (1) is preferably set to 0.14, as $f_1/L<0.14$. In order to suppress appearance of spherical aberration of pupil, the lower limit of condition (1) is preferably set to 0.02, as $0.02<f_1/L$.

Condition (2) defines an optimum ratio between the focal length $f_2$ of the second lens group ($G_2$) with the negative refracting power and the distance (object-to-image distance) L from the first object (reticle etc.) to the second object (wafer etc.). This condition (2) is a condition for achieving a compact design as securing a wide exposure region and achieving good correction for Petzval sum.

Here, below the lower limit of condition (2), it becomes difficult to achieve the compact design as securing the wide exposure region and positive Petzval sum will appear, thus not preferred. In order to achieve further compact design or superior correction for Petzval sum, the lower limit of condition (2) is preferably set to −0.032, as $-0.032<f_2/L$. In order to suppress appearance of negative distortion, the upper limit of condition (2) is preferably set to −0.005, as $f_2/L<-0.005$.

Condition (3) defines an optimum ratio between the focal length $f_3$ of the third lens group ($G_3$) with the positive refracting power and the distance (object-to-image distance) L from the first object (reticle etc.) to the second object (wafer etc.). Here, below the lower limit of condition (3), the refractive power of the second lens group ($G_2$) or the fourth lens group ($G_4$) becomes too strong, resulting in giving rise to negative distortion and coma in the second lens group ($G_2$) or giving rise to coma in the fourth lens group ($G_4$). On the other hand, above the upper limit of condition (3), the refractive power of the second lens group ($G_2$) or the fourth lens group ($G_4$) becomes too weak, failing to well correct Petzval sum.

Condition (4) defines an optimum ratio between the focal length $f_4$ of the fourth lens group ($G_4$) with the negative refracting power and the distance (object-to-image distance) L from the first object (reticle etc.) to the second object (wafer etc.).

Here, above the upper limit of condition (4), coma will appear, thus not preferred. Further, in order to suppress appearance of coma, the upper limit of condition (4) is preferably set to −0.047, as $f_4/L<-0.047$.

In order to well correct spherical aberration, the lower limit of condition (4) is preferably set to −0.098, as $-0.098<f_4/L$.

Condition (5) defines an optimum ratio between the focal length $f_5$ of the fifth lens group ($G_5$) with the positive refracting power and the distance (object-to-image distance) L from the first object (reticle etc.) to the second object (wafer etc.). This condition (5) is for achieving well-balanced correction for spherical aberration, distortion, and Petzval sum as maintaining a large numerical aperture. Below the lower limit of this condition (5), the refracting power of the fifth lens group ($G_5$) becomes too strong, resulting in giving rise to great negative spherical aberration in addition to negative distortion in the fifth lens group ($G_5$). Above the upper limit of this condition (5), the refracting power of the fifth lens group ($G_5$) becomes too weak, which inevitably weakens the refracting power of the fourth lens group ($G_4$) with the negative refracting power. As a consequence, Petzval sum will not be well corrected.

Condition (6) defines an optimum ratio between the focal length $f_6$ of the sixth lens group ($G_6$) with the positive refracting power and the distance (object-to-image distance) L from the first object (reticle etc.) to the second object (wafer etc.). This condition (6) is for suppressing appearance of higher-order spherical aberration and negative distortion as maintaining a large numerical aperture. Below the lower limit of this condition (6), the sixth lens group ($G_6$) itself gives rise to great negative distortion; above the upper limit of this condition (6), higher-order spherical aberration will appear.

On the basis of the above composition it is preferred that when I is an axial distance from the first object to a first-object-side focal point F of the entire projection optical system and L is the distance from the first object to the second object, the following condition be satisfied:

$$1.0<I/L. \quad (7)$$

The condition (7) defines an optimum ratio between the axial distance I from the first object to the first-object-side focal point F of the entire projection optical system and the distance (object-image distance) L from the first object (reticle etc.) to the second object (wafer etc.). Here, the first-object-side focal point F of the entire projection optical system means an intersecting point of outgoing light from the projection optical system with the optical axis after collimated light beams are let to enter the projection optical system on the second object side in the paraxial region with respect to the optical axis of the projection optical system and when the light beams in the paraxial region are outgoing from the projection optical system.

Below the lower limit of this condition (7) the first-object-side telecentricity of the projection optical system will become considerably destroyed, so that changes of magnification and distortion due to an axial deviation of the first object will become large. As a result, it becomes difficult to faithfully project an image of the first object at a desired magnification onto the second object. In order to fully suppress the changes of magnification and distortion due to the axial deviation of the first object, the lower limit of the above condition (7) is preferably set to 1.7, i.e., $1.7<I/L$. Further, in order to correct a spherical aberration and a distortion of the pupil both in a good balance while maintaining the compact design of the projection optical system, the upper limit of the above condition (7) is preferably set to 6.8, i.e., $I/L<6.8$.

It is also preferred that the fourth lens group ($G_4$) have a front lens group disposed as closest to the first object and a rear lens group disposed as closest to the second object, that an intermediate lens group having a first negative lens ($L_{43}$) and a second negative lens ($L_{44}$) in order from the side of the first object be disposed between the front lens group in the fourth lens group ($G_4$) and the rear lens group in the fourth lens group ($G_4$), that the front lens group have two negative meniscus lenses ($L_{41}$, $L_{42}$) each shaped with a concave surface to the second object, that the rear lens group has a negative lens ($L_{46}$) with a concave surface to the first object, and that when $f_{4A}$ is a focal length of the first negative lens ($L_{43}$) in the fourth lens group ($G_4$) and $f_{4B}$ is a focal length of the second negative lens ($L_{44}$) in the fourth lens group ($G_4$), the following condition be satisfied:

$$0.05<f_{4A}/f_{4B}<20. \quad (8)$$

Below the lower limit of condition (8), the refractive power of the first negative lens ($L_{43}$) becomes strong relative to the refractive power of the second negative lens ($L_{44}$), so that the first negative lens ($L_{43}$) will give rise to higher-order spherical aberration and higher-order coma. In order to suppress appearance of the higher-order spherical aberration and higher-order coma, the lower limit of the above condition (8) is preferably set to 0.1, as $0.1<f_{4A}/f_{4B}$. On the other hand, above the upper limit of condition (8), the refracting power of the second negative lens ($L_{44}$) becomes strong relative to the refracting power of the first negative lens ($L_{43}$), so that the second negative lens ($L_{44}$) will give rise to higher-order spherical aberration and higher-order coma. In order to further suppress appearance of higher-order spherical aberration and higher-order coma, the upper limit of the above condition (8) is preferably set to 10, as $f_{4A}/f_{4B}<10$.

It is also preferred that when $r_{2Ff}$ is a radius of curvature of a first-object-side surface of the front lens ($L_2F$) and $r_{2Fr}$ is a radius of curvature of a second-object-side surface of the front lens ($L_{2F}$), the front lens ($L_{2F}$) in the second lens group ($G_2$) satisfy the following condition:

$$1.00\leqq(r_{2Ff}-r_{2Fr})/(r_{2Ff}+r_{2Fr})<5.0. \quad (9)$$

Below the lower limit of this condition (9), sufficient correction for spherical aberration of pupil becomes impossible, thus not preferred. On the other hand, above the upper limit of this condition (9), coma will appear, thus not preferred.

It is also preferred that the fourth lens group ($G_4$) have a front lens group having a negative lens ($L_{41}$) disposed as closest to the first object and shaped with a concave surface to the second object, and a rear lens group having a negative lens ($L_{46}$) disposed as closest to the second object and shaped with a concave surface to the first object, that an intermediate lens group having at least a negative lens ($L_{44}$) and a positive lens ($L_{45}$) with a convex surface adjacent to a concave surface of the negative lens ($L_{44}$) be disposed between the front lens group in the fourth lens group ($G_4$) and the rear lens group in the fourth lens group ($G_4$), and that when $r_{4N}$ is a radius of curvature of the concave surface of the negative lens ($L_{44}$) in the intermediate lens group and $r_{4P}$ is a radius of curvature of the convex surface of the positive lens ($L_{45}$) in the intermediate lens group, the following condition be satisfied:

$$-0.9<(r_{4N}-r_{4P})/(r_{4N}+r_{4P})<0.9, \quad (10)$$

provided that when L is the distance from the first object to the second object, the concave surface of the negative lens ($L_{44}$) in the intermediate lens group or the convex surface of the positive lens ($L_{45}$) in the intermediate lens group satisfies at least one of the following conditions:

$$|r_{4N}/L|<2.0 \quad (11)$$

$$|r_{4P}/L|<2.0. \quad (12)$$

Conditions (10) to (12) define an optimum configuration of a gas lens formed by the concave surface of the negative lens ($L_{44}$) in the intermediate lens group and the convex surface of the positive lens ($L_{45}$) in the intermediate lens group. When condition (11) or (12) is satisfied, this gas lens can correct higher-order spherical aberration. For further correction of higher-order spherical aberration, the upper limits of condition (11) and condition (12) are preferably set to 0.8, as $|r_{4N}/L|<0.8$ and $|r_{4P}/L|<0.8$. Here, above the upper limit or below the lower limit of condition (10), coma will appear, thus not preferred. If neither condition (11) nor condition (12) is satisfied, correction for higher-order spherical aberration is impossible even if condition (10) is satisfied, thus not preferred.

It is also preferred that when $f_{22}$ is a focal length of the second lens ($L_{M2}$) with the negative refracting power in the second lens group ($G_2$) and $f_{23}$ is a focal length of the third lens ($L_{M3}$) with the negative refracting power in the second lens group ($G_2$), the following condition be satisfied:

$$0.1<f_{22}/f_{23}<10. \quad (13)$$

Below the lower limit of the condition (13) the refracting power of the second negative lens ($L_{M2}$) becomes strong relative to the refracting power of the third negative lens ($L_{M3}$), so that the second negative lens ($L_{M2}$) generates a large coma and a large negative distortion. In order to correct the negative distortion in a better balance, the lower limit of the above condition (13) is preferably set to 0.7, i.e., $0.7<f_{22}/f_{23}$. Above the upper limit of this condition (13) the refracting power of the third negative lens ($L_{M3}$) becomes strong relative to the refracting power of the second negative lens ($L_{M2}$), so that the third negative lens generates a large coma and a large negative distortion. In order to correct the negative distortion in a better balance while well correcting the coma, the upper limit of the above condition (13) is preferably set to 1.5, i.e., $f_{24}/f_{23}<1.5$.

It is also preferred that the fifth lens group ($G_5$) have a negative meniscus lens (for example, $L_{54}$), and a positive lens (for example, $L_{53}$) disposed as adjacent to a concave surface of the negative meniscus lens and having a convex surface opposed to the concave surface of the negative meniscus lens and that when $r_{5n}$ is a radius of curvature of the concave surface of the negative meniscus lens in the fifth lens group ($G_5$) and $r_{5P}$ is a radius of curvature of the convex surface, opposed to the concave surface of the negative meniscus lens, of the positive lens disposed as adjacent to the concave surface of the negative meniscus lens in the fifth lens group ($G_5$), the following condition be satisfied:

$$0<(r_{5P}-r_{5n})/(r_{5P}+r_{5n})<1. \quad (14)$$

In this case, it is preferred that the negative meniscus lens (for example, $L_{54}$) and the positive lens ($L_{53}$) adjacent to the concave surface of the negative meniscus lens be disposed between at least one positive lens (for example, $L_{52}$) in the fifth lens group $G_5$ and at least one positive lens (for example, $L_{55}$) in the fifth lens group ($G_5$).

In this case, in order to suppress the negative distortion without generating the higher-order spherical aberrations in the lens ($L_{61}$) located closest to the first object in the sixth lens group ($G_6$), it is desirable that the lens surface closest to the first object have a shape with a convex surface to the first object and that the following condition be satisfied when a radius of curvature on the second object side, of the negative lens ($L_{58}$) placed as closest to the second object in the fifth lens group ($G_5$) is $r_{5R}$ and a radius of curvature on the first object side, of the lens ($L_{61}$) placed as closest to the first object in the sixth lens group ($G_6$) is $r_{6F}$.

$$-0.90<(r_{5R}-r_{6F})/(r_{5R}+r_{6F})<-0.001 \quad (15)$$

This condition (15) defines an optimum shape of a gas lens formed between the fifth lens group ($G_5$) and the sixth lens group ($G_6$). Below the lower limit of this condition (15) a curvature of the second-object-side concave surface of the negative lens ($L_{58}$) located closest to the second object in the fifth lens group ($G_5$) becomes too strong, thereby generating higher-order comas. Above the upper limit of this condition (15) refracting power of the gas lens itself formed between the fifth lens group ($G_5$) and the sixth lens group ($G_6$) becomes weak, so that a quantity of the positive distortion generated by this gas lens becomes small, which makes it difficult to well correct a negative distortion generated by the positive lens in the fifth lens group ($G_5$). In order to fully suppress the generation of higher-order comas, the lower limit of the above condition (15) is preferably set to −0.30, i.e., $-0.30<(r_{5R}-r_{6F})/(r_{5R}+r_{6F})$.

Also, it is further preferable that the following condition be satisfied when a lens group separation between the fifth lens group ($G_5$) and the sixth lens group ($G_6$) is $d_{56}$ and the distance from the first object to the second object is L.

$$d_{56}/L<0.017 \quad (16)$$

Above the upper limit of this condition (16), the lens group separation between the fifth lens group ($G_5$) and the sixth lens group ($G_6$) becomes too large, so that a quantity of the positive distortion generated becomes small. As a result, it becomes difficult to correct the negative distortion generated by the positive lens in the fifth lens group ($G_5$) in a good balance.

Also, it is more preferable that the following condition be satisfied when a radius of curvature of the lens surface closest to the first object in the sixth lens group ($G_6$) is $r_{6F}$ and an axial distance from the lens surface closest to the first object in the sixth lens group ($G_6$) to the second object is $d_6$.

$$0.50<d_6/r_{6F}<1.50 \quad (17)$$

Below the lower limit of this condition (17), the positive refracting power of the lens surface closest to the first object in the sixth lens group ($G_6$) becomes too strong, so that a large negative distortion and a large coma are generated. Above the upper limit of this condition (17), the positive refracting power of the lens surface closest to the first object in the sixth lens group ($G_6$) becomes too weak, thus generating a large coma. In order to further suppress the generation of coma, the lower limit of the condition (17) is preferably set to 0.84, i.e., $0.84<d_6/r_6F$.

Also, it is to be more desired that said fifth lens group ($G_5$) have a negative lens ($L_{58}$) placed as closest to the second object and having a concave surface opposed to the second object and that the following condition be satisfied when a radius of curvature on the first object side in the negative lens ($L_{58}$) closest to the second object in said fifth lens group ($G_5$) is $r_{5F}$ and a radius of curvature on the second object side in the negative lens ($L_{58}$) closest to the second object in said fifth lens group ($G_5$) is $r_{5R}$:

$$0.30<(r_{5F}-r_{5R})/(r_{5F}+r_{5R})<1.28. \quad (18)$$

Below the lower limit of this condition (18), it becomes difficult to correct both the Petzval sum and the coma; above the upper limit of this condition (18), large higher-order comas appear, which is not preferable. In order to further prevent the generation of higher-order comas, the upper limit of the condition (18) is preferably set to 0.93, i.e., $(r_{5F}-r_{5R})/(r_{5F}+r_{5R})<0.93$.

It is more desired that when $f_{21}$ is a focal length of the first lens ($L_{M1}$) with the positive refracting power in the intermediate lens group ($G_{2M}$) in the second lens group ($G_2$) and L is the distance from the first object to the second object, the following condition be satisfied:

$$0.230<f_{21}/L<0.40. \quad (19)$$

Below the lower limit of condition (19), positive distortion will appear; above the upper limit of condition (19), negative distortion will appear, either of which is thus not preferred. Further, in order to further correct the negative distortion, the second-object-side lens surface of the first lens ($L_{M1}$) is preferably formed in a lens configuration shaped with a convex surface facing the second object.

It is also preferred that when $f_{2F}$ is a focal length of the front lens ($L_{2F}$) with the negative refracting power disposed as closest to the first object in the second lens group ($G_2$) and shaped with the concave surface to the second object and $f_{2R}$ is a focal length of the rear lens ($L_{2R}$) with the negative refracting power disposed as closest to the second object in the second lens group ($G_2$) and shaped with the concave surface to the first object, the following condition be satisfied:

$$0\leq f_{2F}/f_{2R}<18. \quad (20)$$

Also, the front lens ($L_{2F}$) and the rear lens ($L_{2R}$) in the second lens group ($G_2$) preferably satisfy the following condition when the focal length of the front lens ($L_{2F}$)

placed as closest to the first object in the second lens group ($G_2$) and having the negative refracting power with a concave surface to the second object is $f_{2F}$ and the focal length of the rear lens ($L_{2R}$) placed as closest to the second object in the second lens group ($G_2$) and having the negative refracting power with a concave surface to the second object is $f_{2R}$.

$$0 \leq f_{2F}/f_{2R} < 18 \quad (20)$$

The condition (20) defines an optimum ratio between the focal length $f_{2R}$ of the rear lens ($L_{2R}$) in the second lens group ($G_2$) and the focal length $f_{2F}$ of the front lens ($L_{2F}$) in the second lens group ($G_2$). Below the lower limit and above the upper limit of this condition (20), a balance is destroyed for refracting power of the first lens group ($G_1$) or the third lens group ($G_3$), which makes it difficult to correct the distortion well or to correct the Petzval sum and the astigmatism simultaneously well.

In order to further well correct Petzval sum, the intermediate lens group ($G_{2M}$) in the second lens group ($G_2$) preferably has a negative refracting power.

For the above lens groups to achieve satisfactory aberration correction functions, specifically, they are desired to be constructed in the following arrangements.

First, for the fist lens group ($G_1$) to have a function to suppress appearance of higher-order distortion and appearance of spherical aberration of pupil, the first lens group ($G_1$) preferably has at least two positive lenses; for the third lens group ($G_3$) to have a function to suppress degradation of spherical aberration and Petzval sum, the third lens group ($G_3$) preferably has at least three positive lenses; further, for the fourth lens group ($G_4$) to have a function to suppress appearance of coma as correcting Petzval sum, the fourth lens group ($G_4$) preferably has at least three negative lenses. For the fifth lens group ($G_5$) to have a function to suppress appearance of negative distortion and spherical aberration, the fifth lens group ($G_5$) preferably has at least five positive lenses; further, for the fifth lens group ($G_5$) to have a function to correct negative distortion and Petzval sum, the fifth lens group ($G_5$) preferably has at least one negative lens. For the sixth lens group ($G_6$) to effect focus on the second object so as not to give rise to large spherical aberration, the sixth lens group ($G_6$) preferably has at least one positive lens.

For further compact design, the intermediate lens group in the second lens group desirably comprises only two negative lenses.

For the sixth lens group ($G_6$) to have a function to further suppress appearance of negative distortion, the sixth lens group ($G_6$) is preferably arranged to comprise three or less lenses including at least one lens surface satisfying the following condition (21).

$$1/|\Phi L| < 20 \quad (21)$$

where $\Phi$: a refractive power of the lens surface; and

L: the distance (object-to-image distance) from the first object to the second object.

The refractive power of lens surface, stated here, is given by the following equation where r is a radius of curvature of the lens surface, $n_1$ a refractive index of a medium on the first object side of the lens surface, and $n_2$ a refractive index of a medium on the second object side of the lens surface.

$$\Phi = (n_2 - n_1)/r$$

Here, if there are four or more lenses having the lens surface satisfying this condition (21), the number of lens surfaces with some curvature, located near the second object, becomes increased, which generates the distortion, thus not preferable.

The present invention will become more fully understood from the detailed description given hereinbelow and the accompanying drawings which are given by way of illustration only, and thus are not to be considered as limiting the present invention.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art form this detailed description.

BRIEF DESCRIPTION OF THE DRAWINGS

FIGS. 19–22 are aberration diagrams to show aberrations in the projection optical system of the fourth embodiment.

DETAILED DESCRIPTION OF THE PREFERRED EMBODIMENTS

Figure 1:
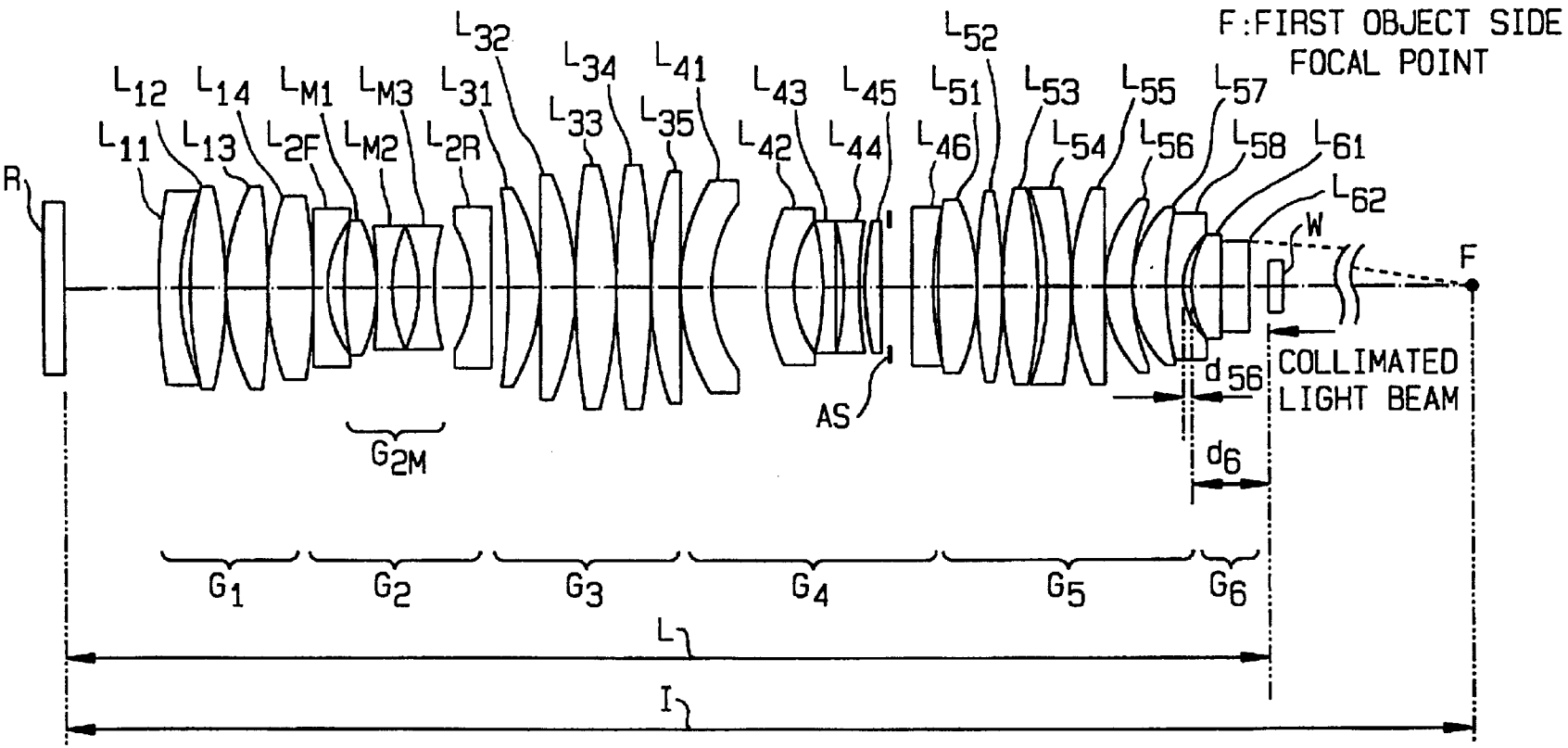
FIG. 1 is a drawing to show parameters defined in embodiments of the present invention.
Figure 2:
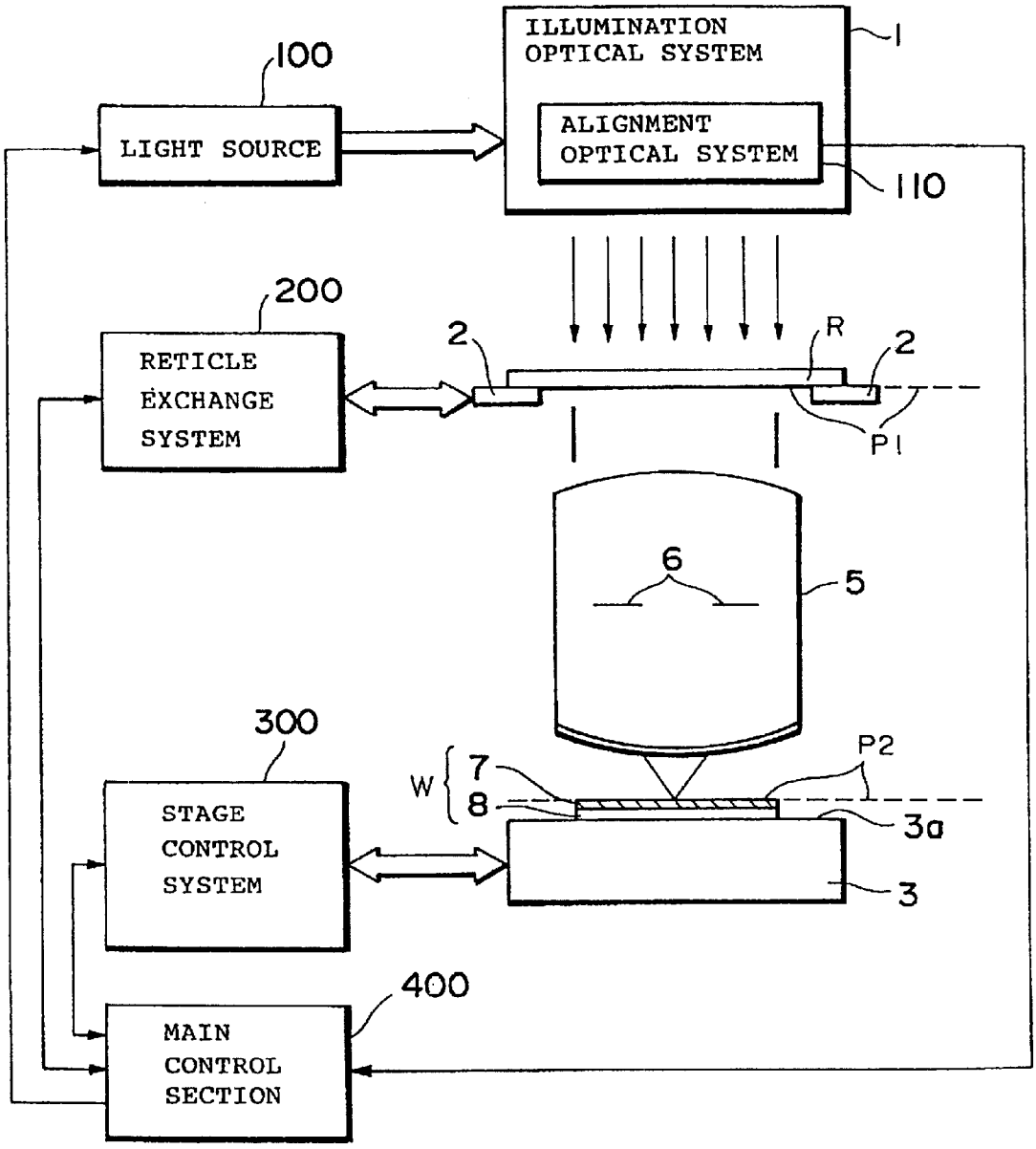
FIG. 2 is a drawing to show schematic structure of an exposure apparatus to which the projection optical system according to the present invention is applied.

Various embodiments of the projection optical system according to the present invention will be described with reference to the drawings. In the examples, the present invention is applied to the projection optical system in the projection exposure apparatus for projecting an image of patterns of reticle onto a wafer coated with a photoresist. FIG. 2 shows a basic structure of the exposure apparatus according to the present invention. As shown in FIG. 2, an exposure apparatus of the present invention comprises at least a wafer stage 3 allowing a photosensitive substrate W to be held on a main surface 3a thereof, an illumination optical system 1 for emitting exposure light of a predetermined wavelength and transferring a predetermined pattern of a mask (reticle R) onto the substrate W, a light source 100 for supplying an exposure light to the illumination optical system 1, a projection optical system 5 provided between a first surface P1 (object plane) on which the mask R is disposed and a second surface P2 (image plane) to which a surface of the substrate W is corresponded, for projecting an image of the pattern of the mask R onto the substrate W. The illumination optical system 1 includes an alignment optical system 110 for adjusting a relative positions between the mask R and the wafer W, and the mask R is disposed on a reticle stage 2 which is movable in parallel with respect to the main surface of the wafer stage 3. A reticle exchange system 200 conveys and changes a reticle (mask R) to be set on the reticle stage 2. The reticle exchange system 200 includes a stage driver for moving the reticle stage 2 in parallel with respect to the main surface 3a of the wafer stage 3. The projection optical system 5 has a space permitting an aperture stop 6 to be set therein. The sensitive substrate W comprises a wafer 8 such as a silicon wafer or a glass plate, etc., and a photosensitive material 7 such as a photoresist or the like coating a surface of the wafer 8. The wafer stage 3 is moved in parallel with respect to a object plane P1 by a stage control system 300. Further, since a main control section 400 such as a computer system controls the light source 100, the reticle exchange system 200, the stage control system 300 or the like, the exposure apparatus can perform a harmonious action as a whole.

The techniques relating to an exposure apparatus of the present invention are described, for example, in U.S. patent applications Ser. Nos. 255,927, 260,398, 299,305, U.S. Pat. Nos. 4,497,015, 4,666,273, 5,194,893, 5,253,110, 5,333,035, 5,365,051, 5,379,091, or the like. The reference of U.S. patent application Ser. No. 255,927 teaches an illumination optical system (using a laser source) applied to a scan type exposure apparatus. The reference of U.S. patent application Ser. No. 260,398 teaches an illumination optical system (using a lamp source) applied to a scan type exposure apparatus. The reference of U.S. patent application Ser. No. 299,305 teaches an alignment optical system applied to a scan type exposure apparatus. The reference of U.S. Pat. No. 4,497,015 teaches an illumination optical system (using a lamp source) applied to a scan type exposure apparatus. The reference of U.S. Pat. No. 4,666,273 teaches a step-and repeat type exposure apparatus capable of using the projection optical system of the present invention. The reference of U.S. Pat. No. 5,194,893 teaches an illumination optical system, an illumination region, mask-side and reticle-side interferometers, a focusing optical system, alignment optical system, or the like. The reference of U.S. Pat. No. 5,253,110 teaches an illumination optical system (using a laser source) applied to a step-and-repeat type exposure apparatus. The '110 reference can be applied to a scan type exposure apparatus. The reference of U.S. Pat. No. 5,333,035 teaches an application of an illumination optical system applied to an exposure apparatus. The reference of U.S. Pat. No. 5,365,051 teaches a auto-focusing system applied to an exposure apparatus. The reference of U.S. Pat. No. 5,379,091 teaches an illumination optical system (using a laser source) applied to a scan type exposure apparatus.

As described above, a reticle R (first object) as a projection mask with specific circuit patterns formed therein is disposed on the object plane (P1) of the projection optical system 1 and a wafer W (second object) as a substrate on the image plane (P2) of the projection optical system 1. Here, the reticle R is held on a reticle stage 2 and the wafer W on a wafer stage 3 arranged as movable on a two-dimensional basis. Disposed above the reticle R is an illumination optical system 1 for uniformly illuminating the reticle R.

In the above arrangement, light supplied from the light source 100 through the illumination optical system 1 illuminates the reticle R to form an image at the pupil position of the projection optical system 1 (the position of aperture stop 6). Namely, the illumination optical system 1 uniformly illuminates the reticle R under Köhler illumination. Then the pattern image of reticle R illuminated under Köhler illumination is projected (or transferred) onto the wafer W.

The present embodiment shows an example of which the light source 100 is a mercury lamp for supplying the i-line (365 nm). The structure of the projection optical system in each embodiment will be described by reference to FIG. 3 to FIG. 6. FIG. 3 to FIG. 6 are lens structural drawings of the projection optical systems 1 in the first to fourth embodiments, respectively, according to the present invention.

As shown in FIG. 3 to FIG. 6, the projection optical system 1 in each embodiment has a first lens group $G_1$ with a positive refractive power, a second lens group $G_2$ with a negative refractive power, a third lens group $G_3$ with a positive refractive power, a fourth lens group $G_4$ with a negative refractive power, a fifth lens group $G_5$ with a positive refractive power, and a sixth lens unit $G_6$ with a positive refractive power in order from the side of reticle R as a first object, is arranged as substantially telecentric on the object side (reticle R side) and on the image side (wafer W side), and has a reduction magnification.

In the projection optical system 1 in each of the embodiments shown in FIG. 3 to FIG. 6, an object-to-image distance (a distance along the optical axis from the object plane to the image plane, or a distance along the optical axis from the reticle R to wafer W) L is 1100, an image-side numerical aperture NA is 0.57, a projection magnification β is ⅕, and a diameter of an exposure area on the wafer W is 31.2. The object-to-image distance L and the diameter of the exposure area are expressed in a same unit, and the unit corresponds to a unit of r and d shown in the following tables 1, 3, 5 and 7.

Figure 3:
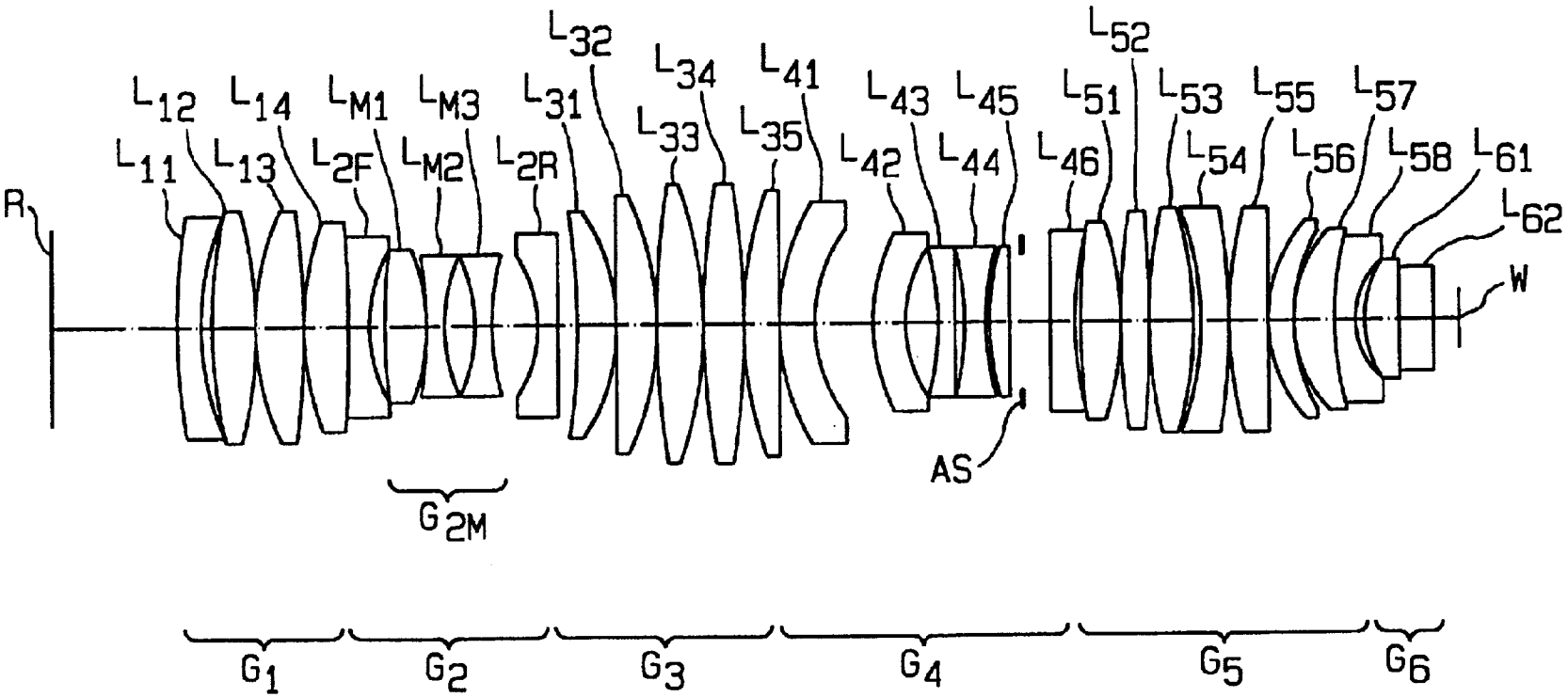
FIG. 3 is a lens arrangement drawing of the projection optical system in the first embodiment according to the present invention.

First described is a specific lens arrangement of the first embodiment shown in FIG. 3. The first lens group $G_1$ has a negative meniscus lens $L_{11}$ shaped with a concave surface to the image, a positive lens (positive lens of a biconvex shape) $L_{12}$ shaped with a convex surface to the object, and two positive lenses (positive lenses of biconvex shapes) $L_{13}$, $L_{14}$ each shaped with a strong-curvature surface to the object in order from the object side.

Further, the second lens group $G_2$ has a negative lens (negative lens of a biconcave shape: front lens) $L_{2F}$ disposed as closest to the object and shaped with a concave surface to the image, a negative meniscus lens (rear lens) $L_{2R}$ disposed as closest to the image and shaped with a concave surface to the object, and an intermediate lens group $G_{2M}$ with a negative refractive power disposed between these negative lens $L_{2F}$ and negative lens $L_{2R}$. This intermediate lens group $G_{2M}$ has a positive lens (positive lens of a biconvex shape: first lens) $L_{M1}$ shaped with a strong-curvature surface to the image, a negative lens (negative lens of a biconcave shape: second lens) $L_{M2}$ shaped with a strong-curvature surface to the image, and a negative lens (negative lens of a biconcave shape: third lens) $L_{M3}$ shaped with a strong-curvature surface to the object in order from the object side.

The third lens group $G_3$ has two positive lenses (positive meniscus lenses) $L_{31}$, $L_{32}$ each shaped with a strong-curvature surface to the image, a positive lens $L_{33}$ of a biconvex shape, a positive lens (positive lens of a biconvex shape) $L_{34}$ shaped with a strong-curvature surface to the object, and a positive lens (positive meniscus lens) $L_{35}$ shaped with a strong-curvature surface to the object in order from the object side.

The fourth lens group $G_4$ has two negative meniscus lenses (front lens group) $L_{41}$, $L_{42}$ each shaped with a concave surface to the image, a negative lens (negative meniscus lens: first negative lens) $L_{43}$ shaped with a concave surface to the object, a negative lens (second negative lens: negative lens with a concave surface to the image) $L_{44}$ of a biconcave shape, a positive lens (positive meniscus lens: positive lens having a convex surface adjacent to the concave surface of the negative lens $L_{44}$) $L_{45}$ shaped with a convex surface to the object, and a negative lens (negative lens of a biconcave shape: rear lens group) $L_{46}$ shaped with a concave surface to the object in order from the object side.

The fifth lens group $G_5$ has two positive lenses (positive lenses of biconvex shapes) $L_{51}$, $L_{52}$ each shaped with a convex surface to the image, a positive lens $L_{53}$ of a biconvex shape, a negative meniscus lens $L_{54}$ shaped with a concave surface to the object, a positive lens $L_{55}$ shaped with a stronger-curvature surface to the object, two positive lenses (positive meniscus lenses) $L_{56}$, $L_{57}$ each shaped with a stronger-curvature surface to the object, and a negative meniscus lens $L_{58}$ shaped with a concave surface to the image in order from the object side.

Further, the sixth lens group $G_6$ is composed of a positive lens (positive lens of a biconvex shape) $L_{61}$ shaped with a stronger-curvature surface to the object, and a negative lens (negative lens of a biconcave shape) $L_{62}$ with a concave surface to the object in order from the object side.

In the present embodiment, an aperture stop 6 is disposed between the positive meniscus lens $L_{45}$ with the convex surface to the object and the negative lens $L_{46}$ of the biconcave shape, that is, between the intermediate lens group in the fourth lens group $G_4$ and the rear lens group in the fourth lens group $G_4$.

In the first lens group $G_1$ in the present embodiment, the concave surface of the negative meniscus lens $L_{11}$ with the concave surface to the image and the object-side lens surface of the positive biconvex lens $L_{12}$ have nearly equal curvatures and are arranged as relatively close to each other, and these two lens surfaces correct higher-order distortion.

Since the first lens $L_{M1}$ with the positive refractive power in the second lens group $G_{2M}$ is constructed in the biconvex shape with the convex surface to the image and also with the other convex surface to the object, it can suppress appearance of spherical aberration of pupil.

Since the fourth lens group $G_4$ is so arranged that the negative meniscus lens $L_{41}$ with the concave surface to the image is disposed on the object side of the negative lens (negative biconcave lens) $L_{44}$ and that the negative lens $L_{46}$ with the concave surface to the object is disposed on the image side of the negative lens (negative biconcave lens) $L_{44}$, it can correct Petzval sum as suppressing appearance of coma.

Since in the first embodiment the aperture stop 6 is placed between the image-side concave surface of the negative meniscus lens $L_{41}$ and the object-side concave surface of the negative lens $L_{46}$ in the fourth lens group $G_4$, the lens group of from the third lend group $G_3$ to the sixth lens group $G_6$ can be arranged around the aperture stop 6 with a more or less reduction magnification and without destroying the symmetry too much, thus enabling to suppress asymmetric aberration, particularly coma and distortion. Since the positive lens $L_{53}$ in the fifth lens group $G_5$ has a convex surface opposed to the negative meniscus lens $L_{54}$ and the other lens surface on the opposite side to the negative meniscus lens $L_{54}$ is also a convex surface, higher-order spherical aberration can be prevented from appearing with an increase of numerical aperture.

Figure 4:
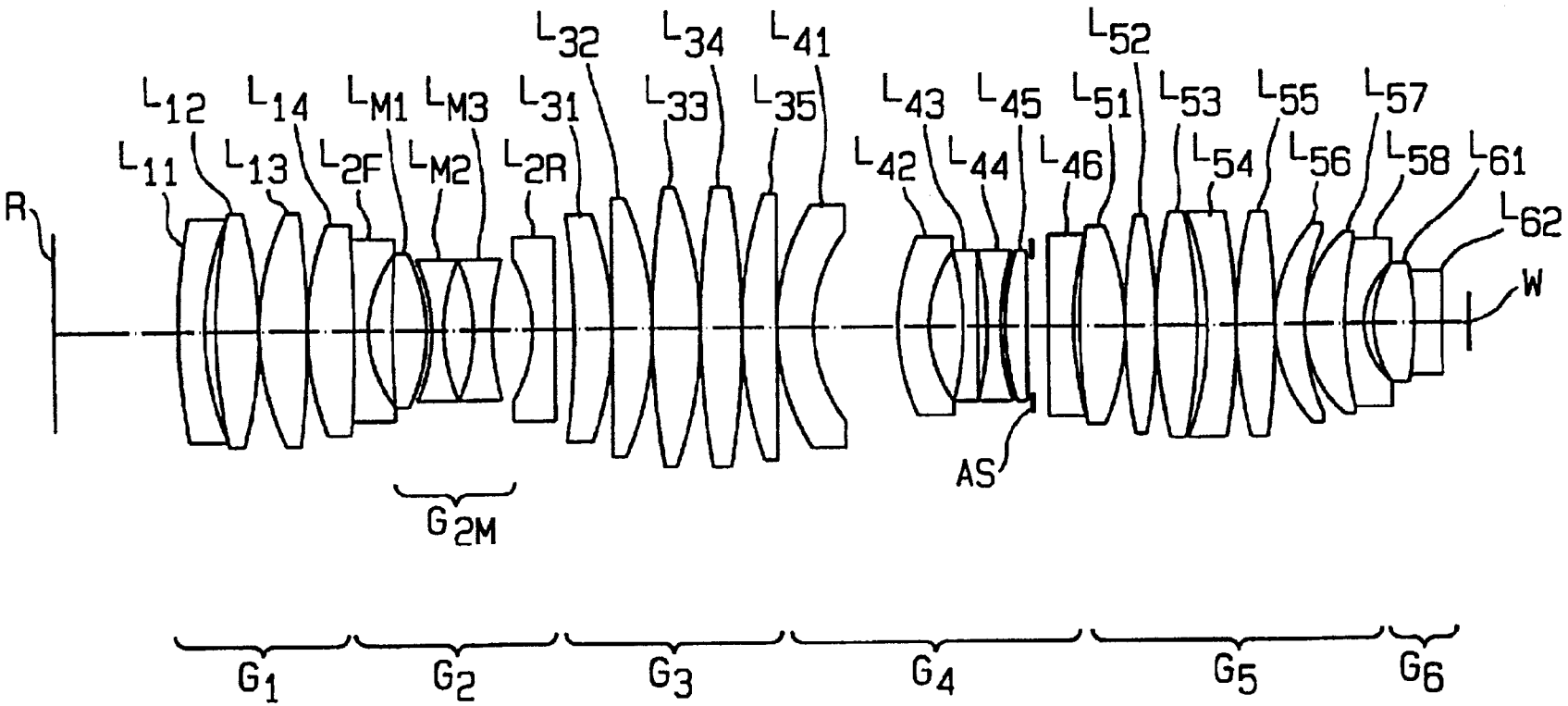
FIG. 4 is a lens arrangement drawing of the projection optical system in the second embodiment according to the present invention.

The specific lens arrangement of the second embodiment shown in FIG. 4 is similar to that of the first embodiment as shown in FIG. 3 and described above. The third lens group $G_3$ in the second embodiment is different from that in the first embodiment in that the third lens group $G_3$ is composed of two positive lenses (positive meniscus lenses) $L_{31}$, $L_{32}$ each shaped with a strong-curvature surface to the image, a positive lens $L_{33}$ of a biconvex shape, a positive lens (positive lens of a biconvex shape) $L_{34}$ shaped with a strong-curvature surface to the object, and a positive lens (positive lens of a biconvex shape) $L_{35}$ shaped with a strong-curvature surface to the object in order from the object side.

In the second embodiment, the fourth lens group $G_4$ is different from that in the first embodiment in that the fourth lens group $G_4$ is composed of two negative meniscus lenses (front lens group) $L_{41}$, $L_{42}$ each shaped with a concave surface to the image, a negative lens (negative lens of a biconcave shape: first negative lens) $L_{43}$ shaped with a concave surface to the object, a negative lens (second negative lens: negative lens with a concave surface to the image) $L_{44}$ of a biconcave shape, a positive lens (positive meniscus lens: positive lens having a convex surface adjacent to the concave surface of the negative lens $L_{44}$) $L_{45}$ shaped with a convex surface to the object, and a negative lens (negative lens of a biconcave shape: rear lens group) $L_{46}$ shaped with a stronger concave surface to the object in order from the object side, but the function thereof is the same as that in the first embodiment as described above.

Further, the first and second lens groups $G_1$, $G_2$ and the fifth and sixth lens groups $G_5$, $G_6$ in the second embodiment achieve the same functions as those in the first embodiment as described above.

Figure 5:
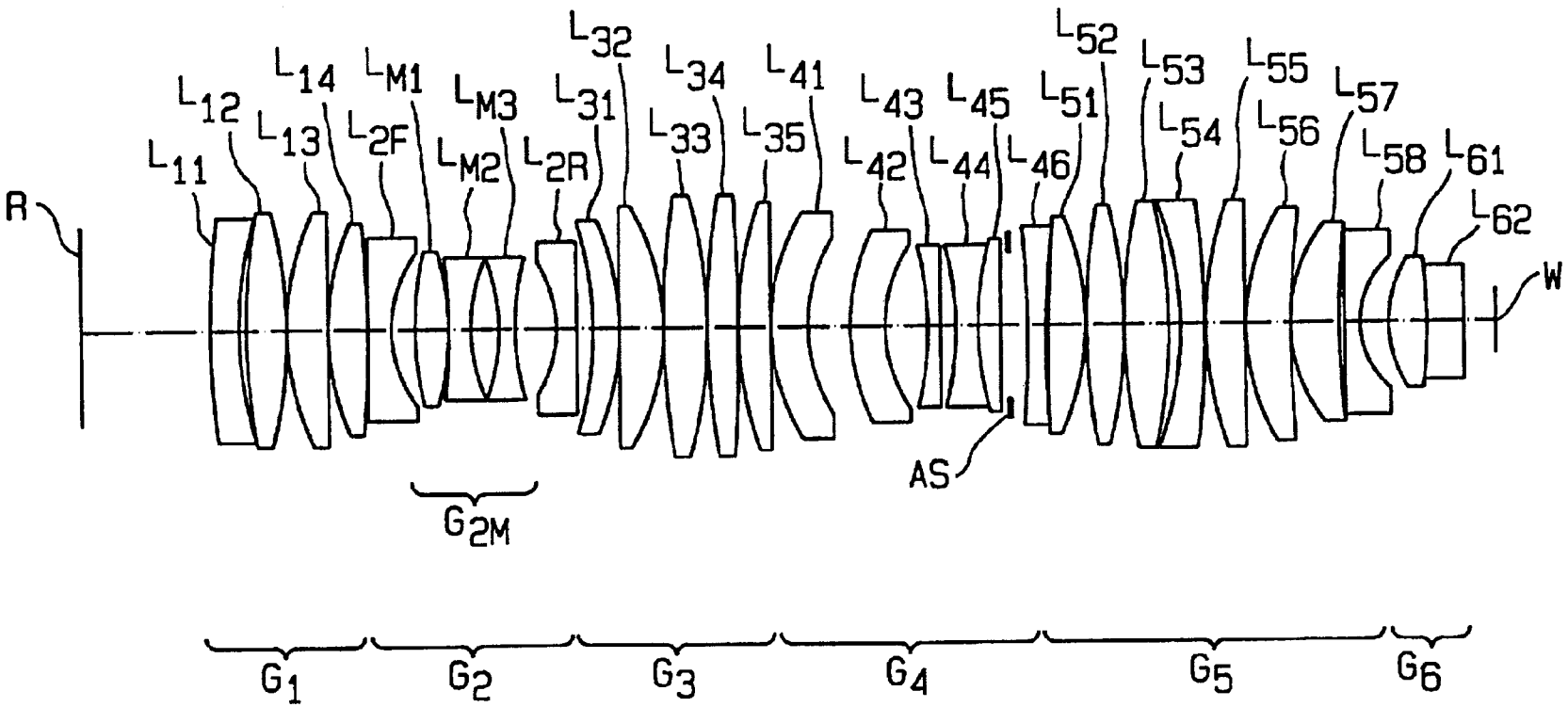
FIG. 5 is a lens arrangement drawing of the projection optical system in the third embodiment according to the present invention.

The specific lens arrangement of the third embodiment shown in FIG. 5 is similar to that of the first embodiment shown in FIG. 3 and described previously. The first lens group $G_1$ of the present embodiment is different from that of the first embodiment in that the first lens group $G_1$ is composed of a negative meniscus lens $L_{11}$ shaped with a concave surface to the image, a positive lens (positive lens of a biconvex shape) $L_{12}$ shaped with a convex surface to the object, a positive lens (positive lens of a plano-convex shape) $L_{13}$ shaped with a strong-curvature surface to the object, and a positive lens (positive lens of a biconvex shape) $L_{14}$ shaped with a strong-curvature surface to the object in order from the object side, but the function thereof is the same as that in the first embodiment as described previously.

The second to sixth lens groups $G_2$–$G_6$ in the third embodiment achieve the same functions as those in the first embodiment as described previously.

Figure 6:
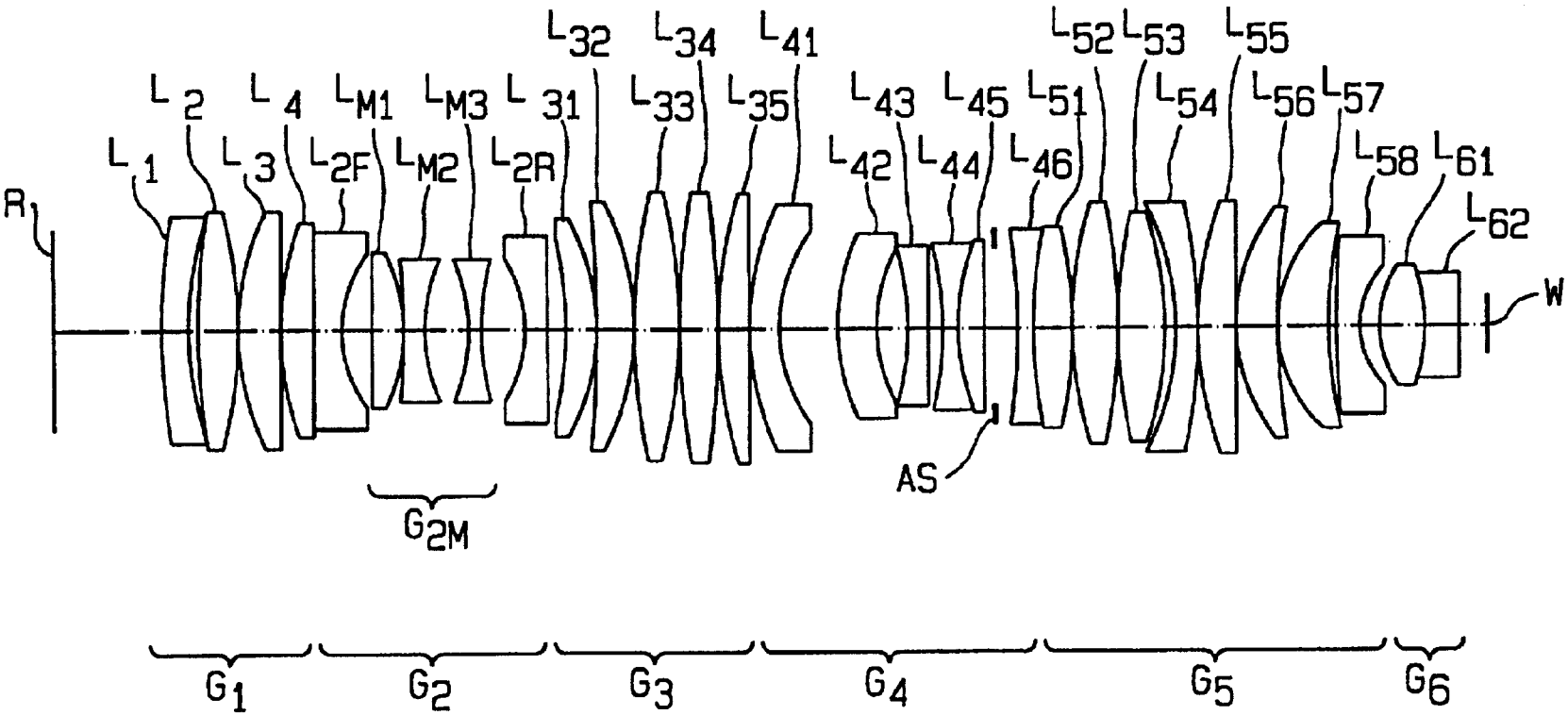
FIG. 6 is a lens arrangement drawing of the projection optical system in the fourth embodiment according to the present invention.
Figures 7, 8, 9, 10:
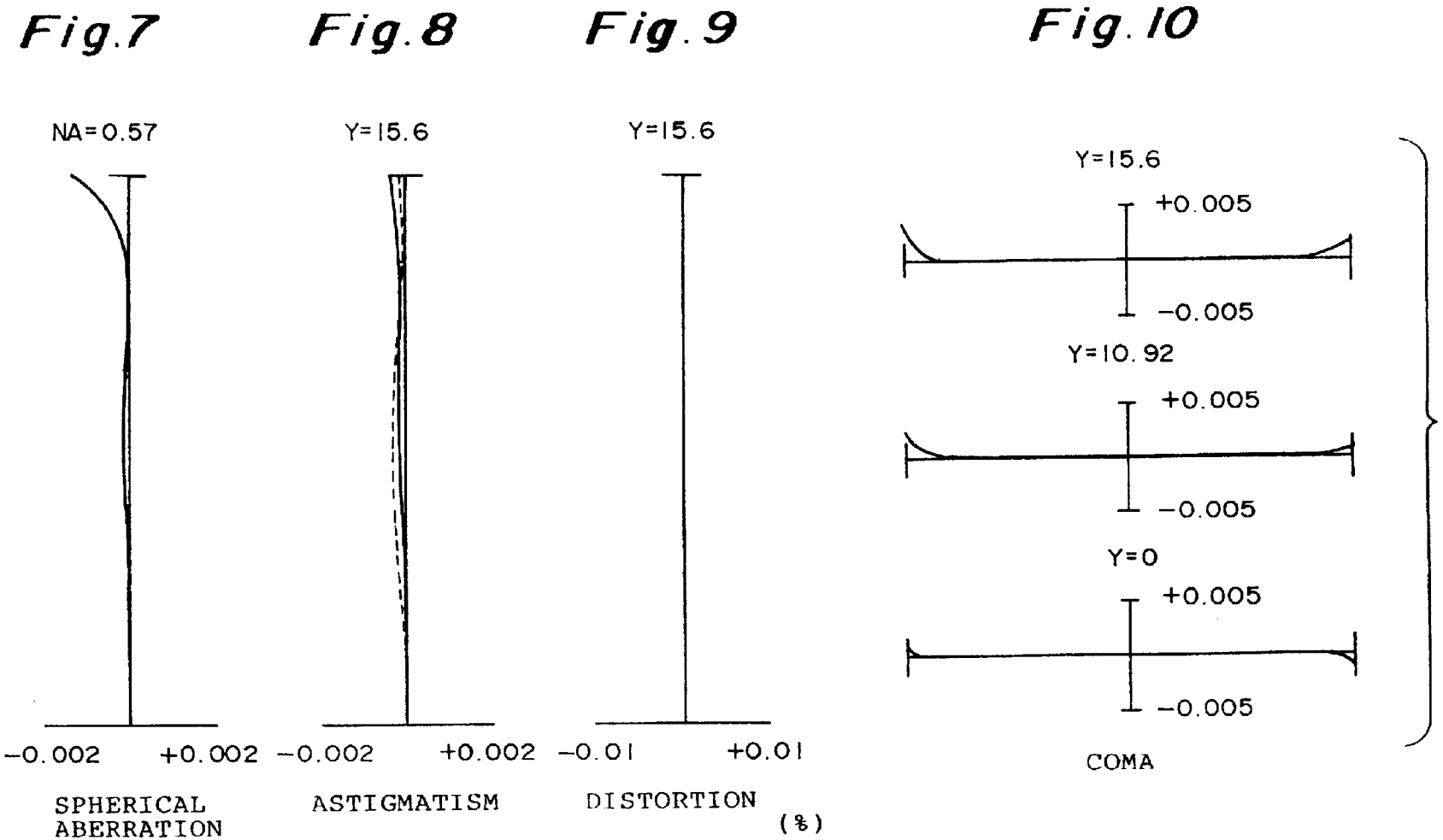
FIGS. 7–10 are aberration diagrams to show aberrations in the projection optical system of the first embodiment.
Figures 11, 12, 13, 14:
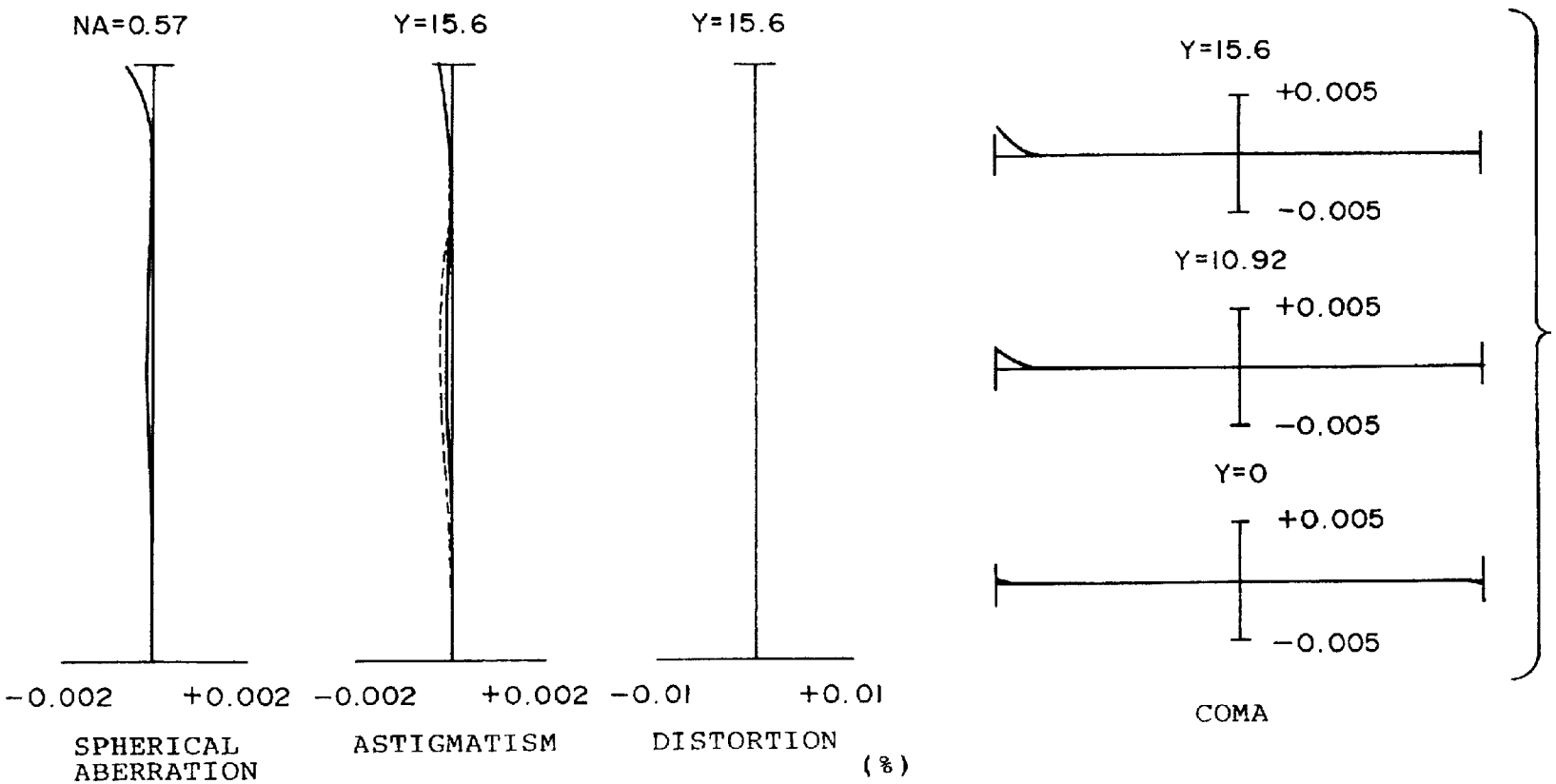
FIGS. 11–14 are aberration diagrams to show aberrations in the projection optical system of the second embodiment.
Figures 15, 16, 17, 18:
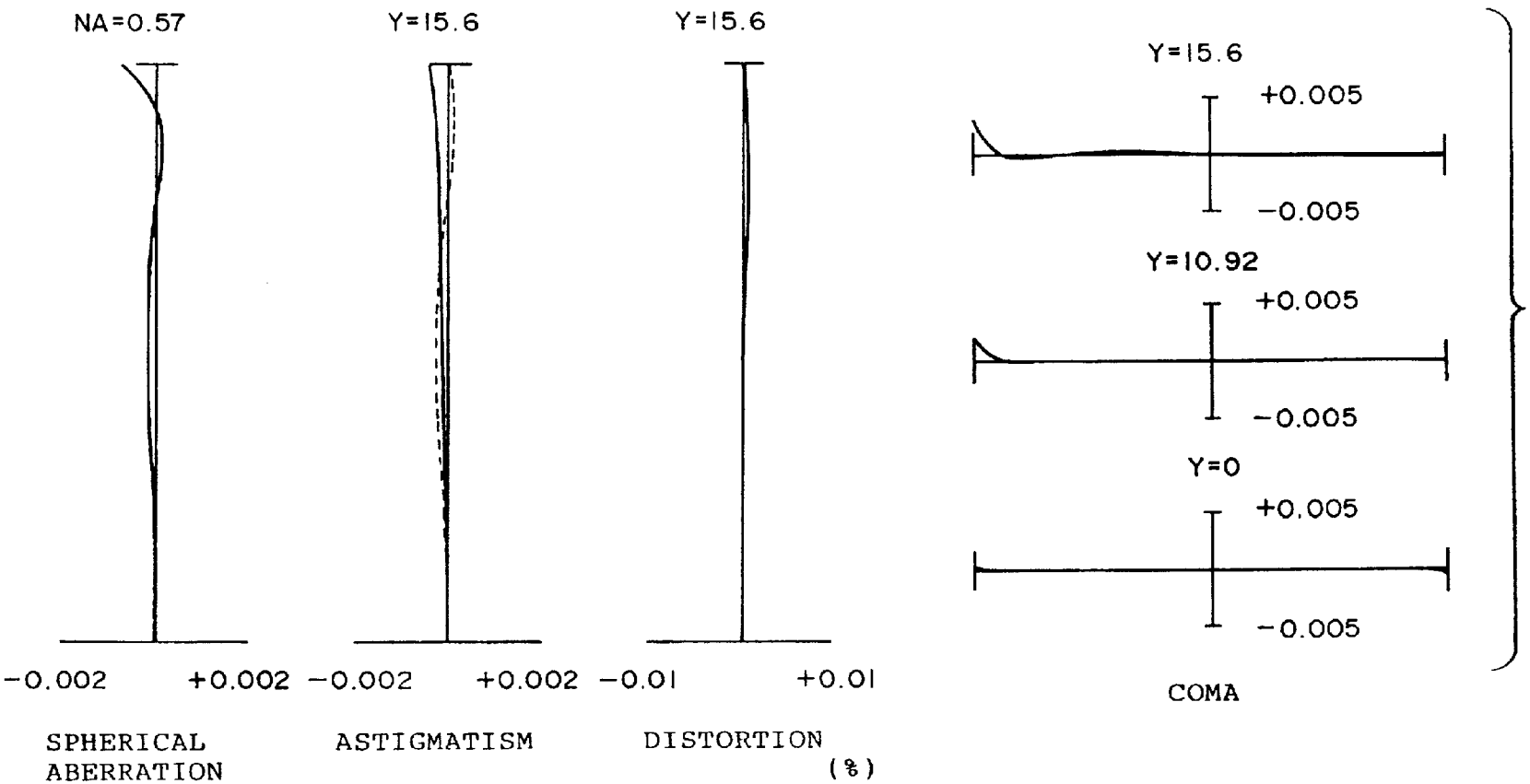
FIGS. 15–18 are aberration diagrams to show aberrations in the projection optical system of the third embodiment.

The specific lens arrangement of the fourth embodiment of FIG. 6 is similar to that of the first embodiment shown in FIG. 3 and described previously. The fourth lens group $G_4$ in the present embodiment is different from that of the first embodiment in that the fourth lens group $G_4$ is composed of two negative meniscus lenses (front lens group) $L_{41}$, $L_{42}$ each with a concave surface to the image, a negative lens (negative lens of a biconcave shape: first negative lens) $L_{43}$ shaped with a concave surface to the object, a negative lens (second negative lens: negative lens with a concave surface to the image) $L_{44}$ of a biconcave shape, a positive lens (positive meniscus lens: a positive lens having a convex surface adjacent to the concave surface of the negative lens $L_{44}$) $L_{45}$ shaped with a convex surface to the object, and a negative lens (negative lens of a biconcave shape: rear lens group) $L_{46}$ shaped with a concave surface to the object in order from the object side, but the function thereof is the same as that in the first embodiment as described previously.

Further, in the fourth embodiment, the sixth lens group $G_6$ is different from that of the first embodiment in that the sixth lens group $G_6$ is composed of a positive lens (positive lens of a biconvex shape) $L_{61}$ shaped with a stronger-curvature surface to the object and a negative lens (negative meniscus lens) $L_{62}$ shaped with a concave surface to the object in order from the object side.

The first to third lens groups $G_1$ to $G_3$ and the fifth lens group $G_5$ in the present embodiment achieve the same functions as those in the first embodiment described previously.

Table 1 to Table 8 to follow list values of specifications and correspondent values to the conditions for the respective embodiments in the present invention.

In the tables, left-end numerals represent orders from the object side (reticle R side), r radii of curvatures of lens surfaces, d separations between lens surfaces, n refractive indices of glass materials for exposure wavelength $\lambda$ of 365 nm, $d_o$ the distance along the optical axis from the first object (reticle R) to the lens surface (first lens surface) closest to the object (reticle R) in the first lens group $G_1$, $\beta$ the projection magnification of projection optical systems, Bf the distance along the optical axis from the lens surface closest to the image (wafer W) in the sixth lens group $G_6$ to the image plane P2 (wafer W plane), NA the numerical aperture on the image side (wafer W side), of projection optical system, and L is the object-to-image distance from the object plane P1 (reticle R plane) to the image plane P2 (wafer W plane). Further, in the tables, $f_1$ represents the focal length of the first lens group $G_1$, $f_2$ the focal length of the second lens group $G_2$, $f_3$ the focal length of the third lens group $G_3$, $f_4$ the focal length of the fourth lens group $G_4$, $f_5$ the focal length of the fifth lens group $G_5$, $f_6$ the focal length of the sixth lens group $G_6$, L the distance (object-to-image distance) from the object plane (reticle plane) to the image plane (wafer plane), I the axial distance from the first object (reticle) to the first-object-side focal point F of the entire projection optical system (provided that the first-object-side focal point F of the entire projection optical system means an intersecting point of emergent light with the optical axis when parallel light in the paraxial region with respect to the optical axis of the projection optical system is made incident from the second object side of the projection optical system and the light in the paraxial region is emergent from the projection optical system), $f_{4A}$ the focal length of the first negative lens ($L_{43}$) in the intermediate lens group in the fourth lens group $G_4$, $f_4$ the focal length of the second negative lens ($L_{44}$) in the intermediate lens group in the fourth lens group $G_4$, $r_{2Ff}$ the radius of curvature of the first-object-side lens surface of the front lens $L_{2F}$ in the second lens group $G_2$, $R_{2Ff}$ the radius of curvature of the second-object-side lens surface of the front lens $L_{2F}$ in the second lens group $G_2$, $r_{4N}$ the radius of curvature of the second-object-side concave surface of the negative lens ($L_{44}$) in the intermediate lens group in the fourth lens group $G_4$, $r_{4P}$ the radius of curvature of the first-object-side convex surface of the positive lens ($L_{45}$) in the intermediate lens group in the fourth lens group $G_4$, $f_{22}$ the focal length of the second lens with the negative refractive power in the second lens group, $f_{23}$ the focal length of the third lens with the negative refractive power in the second lens group $G_2$, $r_{5n}$ the radius of curvature of the concave surface in the negative meniscus lens in the fifth lens group $G_5$, $r_{5p}$ the radius of curvature of the convex surface opposed to the concave surface of the negative meniscus lens in the positive lens disposed as adjacent to the concave surface of the negative meniscus lens in the fifth lens group $G_5$, $r_{5R}$ the radius of curvature of the second-object-side surface of the negative lens disposed as closest to the second object in the fifth lens group $G_5$, $r_{6F}$ the radius of curvature of the first-object-side surface of the lens disposed as closest to the first object in the sixth lens group $G_6$, $d_{56}$ the lens group separation between the fifth lens group $G_5$ and the sixth lens group $G_6$, $d_6$ the axial distance from the lens surface closest to the first object in the sixth lens group $G_6$ to the second object, $r_{5F}$ the radius of curvature of the first-object-side surface in the negative lens disposed as closest to the second object in the fifth lens group $G_5$, $f_{21}$ the focal length of the first lens with the positive refractive power in the intermediate lens group $G_{2M}$ in the second lens group $G_2$, $f_{2F}$ the focal length of the front lens with the negative refractive power disposed as closest to the first object in the second lens group $G_2$ and shaped with the concave surface to the second object, and $f_{2R}$ the focal length of the rear lens of the negative meniscus shape disposed as closest to the second object in the second lens group $G_2$ and shaped with the concave surface to the object.

TABLE 1

First Embodiment
dO = 94.97557
$\beta$ = ⅕
NA = 0.57
Bf = 22.68864
L = 1100

| | r | d | n |
|---|---|---|---|
| 1 | 758.59372 | 18.01962 | 1.66638 |
| 2 | 273.07409 | 8.00000 | |
| 3 | 407.25600 | 34.43806 | 1.53627 |
| 4 | −305.98082 | 0.50000 | |
| 5 | 200.00000 | 36.31512 | 1.53627 |
| 6 | −950.89920 | 0.50000 | |
| 7 | 251.35670 | 36.00000 | 1.53627 |
| 8 | −1111.20100 | 5.00000 | |
| 9 | −3000.00000 | 13.00000 | 1.66638 |
| 10 | 103.53326 | 19.34714 | |
| 11 | 583.43731 | 21.86239 | 1.53627 |
| 12 | −202.73262 | 3.71513 | |
| 13 | −389.07550 | 13.00000 | 1.53627 |
| 14 | 118.39346 | 25.82991 | |
| 15 | −119.29984 | 13.00000 | 1.53627 |
| 16 | 228.68065 | 35.35939 | |
| 17 | −118.78231 | 15.61439 | 1.53627 |
| 18 | −2000.00000 | 15.00000 | |
| 19 | −534.21970 | 30.58806 | 1.53627 |
| 20 | −172.96367 | 0.50000 | |
| 21 | −3045.95900 | 30.55054 | 1.53627 |
| 22 | −252.31005 | 0.50000 | |
| 23 | 787.95642 | 31.33960 | 1.53627 |
| 24 | −470.11486 | 0.50000 | |
| 25 | 429.05519 | 31.10739 | 1.53627 |
| 26 | −1033.56100 | 0.50000 | |
| 27 | 276.54228 | 29.82671 | 1.53627 |
| 28 | 3383.80700 | 0.50000 | |
| 29 | 200.56082 | 25.00000 | 1.53627 |
| 30 | 149.82206 | 51.17799 | |
| 31 | 191.38232 | 25.00000 | 1.53627 |
| 32 | 122.34204 | 25.15581 | |

TABLE 1-continued

First Embodiment
dO = 94.97557
β = ⅕
NA = 0.57
Bf = 22.68864
L = 1100

| | r | d | n |
|---|---|---|---|
| 33 | −276.65501 | 13.00000 | 1.66638 |
| 34 | −597.90043 | 9.14516 | |
| 35 | −190.18194 | 13.00000 | 1.66638 |
| 36 | 360.79756 | 3.75310 | |
| 37 | 434.45763 | 13.00000 | 1.53627 |
| 38 | 643.56408 | 31.17056 | |
| 39 | −951.39487 | 20.00000 | 1.66638 |
| 40 | 360.75541 | 3.46004 | |
| 41 | 395.41239 | 33.29191 | 1.53627 |
| 42 | −229.24043 | 0.50000 | |
| 43 | 405.02177 | 21.76952 | 1.53627 |
| 44 | −1456.27300 | 0.50000 | |
| 45 | 334.62149 | 34.87065 | 1.53627 |
| 46 | −316.02886 | 8.19653 | |
| 47 | −226.66975 | 20.00000 | 1.66638 |
| 48 | −421.19119 | 0.50000 | |
| 49 | 245.00959 | 27.62592 | 1.53627 |
| 50 | −6478.64400 | 0.50000 | |
| 51 | 118.64887 | 24.82664 | 1.53627 |
| 52 | 182.84804 | 0.50000 | |
| 53 | 106.94354 | 29.80517 | 1.53627 |
| 54 | 305.86346 | 2.86446 | |
| 55 | 330.12685 | 13.00000 | 1.66638 |
| 56 | 65.69252 | 7.67289 | |
| 57 | 76.63392 | 29.80077 | 1.53627 |
| 58 | −405.45793 | 2.41289 | |
| 59 | −314.04117 | 20.42250 | 1.53627 |
| 60 | 1180.34006 | (Bf) | |

TABLE 2

Correspondent Values to the Conditions for First Embodiment (1) f1/L = 0.129
(2) f2/L = −0.0299
(3) f3/L = 0.106
(4) f4/L = −0.0697
(5) f5/L = 0.0804
(6) f6/L = 0.143
(7) I/L = 2.02
(8) f4A/f4B = 4.24
(9) (r2Ff − r2Fr)/(r2Ff + r2Fr) = 1.07
(10) (r4N − r4P)/(r4N + r4PY) = −0.0926
(11) |r4N/L| = 0.328
(12) |r4P/L| = 0.395
(13) f22/f23 = 1.16
(14) (r5p − r5n)/(r5p + r5n) = 0.165
(15) (r5R − r6F)/(r5R + r6F) = −0.0769
(16) d56/L = 0.00698
(17) d6/r6F = 0.983
(18) (r5F − r5R)/(r5F + r5R) = 0.668
(19) f21/L = 0.258
(20) f2F/f2R = 0.635

TABLE 3

Second Embodiment
dO = 98.09086
β = ⅕
NA = 0.57
Bf = 22.68864
L = 1100

| | r | d | n |
|---|---|---|---|
| 1 | 715.79825 | 18.01962 | 1.66638 |
| 2 | 257.11993 | 8.00000 | |
| 3 | 402.81202 | 34.43806 | 1.53627 |
| 4 | −298.91362 | 0.50000 | |
| 5 | 200.00000 | 36.31512 | 1.53627 |
| 6 | −811.20841 | 0.50000 | |
| 7 | 202.30081 | 36.00000 | 1.53627 |
| 8 | −912.77876 | −0.24598 | |
| 9 | −3000.00000 | 13.00000 | 1.66638 |
| 10 | 100.16757 | 19.34714 | |
| 11 | 515.50992 | 21.86239 | 1.53627 |
| 12 | −211.08983 | 3.71513 | |
| 13 | −334.85048 | 13.00000 | 1.53627 |
| 14 | 119.28367 | 24.34073 | |
| 15 | −124.53825 | 13.00000 | 1.53627 |
| 16 | 196.56654 | 35.64064 | |
| 17 | −122.83913 | 15.61439 | 1.53627 |
| 18 | −2000.00000 | 15.00000 | |
| 19 | −319.01403 | 30.58806 | 1.53627 |
| 20 | −192.95790 | 0.50000 | |
| 21 | −1320.53000 | 30.55054 | 1.53627 |
| 22 | −229.09627 | 0.50000 | |
| 23 | 1670.41600 | 31.33960 | 1.53627 |
| 24 | −355.67749 | 0.50000 | |
| 25 | 505.94351 | 31.10739 | 1.53627 |
| 26 | −669.94239 | 0.50000 | |
| 27 | 272.78755 | 29.82671 | 1.53627 |
| 28 | −11188.96200 | 0.50000 | |
| 29 | 205.32433 | 25.00000 | 1.53627 |
| 30 | 156.91075 | 68.35861 | |
| 31 | 170.81860 | 25.00000 | 1.53627 |
| 32 | 119.41166 | 25.17539 | |
| 33 | −221.51521 | 13.00000 | 1.66638 |
| 34 | 3749.27900 | 7.91441 | |
| 35 | −299.53056 | 13.00000 | 1.66638 |
| 36 | 360.79756 | 3.75310 | |
| 37 | 434.45763 | 13.00000 | 1.53627 |
| 38 | 643.56408 | 18.53967 | |
| 39 | −6417.33300 | 20.00000 | 1.66638 |
| 40 | 300.16308 | 3.46004 | |
| 41 | 329.77719 | 33.29191 | 1.53627 |
| 42 | −264.12523 | 0.50000 | |
| 43 | 804.85248 | 21.76952 | 1.53627 |
| 44 | −784.29788 | 0.50000 | |
| 45 | 273.73159 | 34.87065 | 1.53627 |
| 46 | −325.58814 | 8.19653 | |
| 47 | −214.52517 | 20.00000 | 1.66638 |
| 48 | −405.91293 | 0.50000 | |
| 49 | 396.09997 | 27.62592 | 1.53627 |
| 50 | −579.80514 | 0.50000 | |
| 51 | 115.71351 | 24.82664 | 1.53627 |
| 52 | 255.34580 | 0.50000 | |
| 53 | 104.86226 | 29.80517 | 1.53627 |
| 54 | 211.50003 | 2.86446 | |
| 55 | 312.25500 | 13.00000 | 1.66638 |
| 56 | 66.11566 | 7.67289 | |
| 57 | 76.78058 | 29.80077 | 1.53627 |
| 58 | −437.18968 | 2.41289 | |
| 59 | −324.32040 | 20.42250 | 1.53627 |
| 60 | 2434.44700 | (Bf) | |

TABLE 4

Correspondent Values to the Conditions for Second Embodiment (1) f1/L = 0.119
(2) f2/L = −0.0292

TABLE 4-continued

| Correspondent Values to the Conditions for Second Embodiment |
|---|
| (3) f3/L = 0.111 |
| (4) f4/L = −0.0715 |
| (5) f5/L = 0.0806 |
| (6) f6/L = 0.140 |
| (7) I/L = 2.02 |
| (8) f4A/f4B = 1.29 |
| (9) (r2Ff − r2Fr)/(r2Ff + r2Fr) = 1.07 |
| (10) (r4N − r4P)/(r4N + r4P) = −0.0926 |
| (11) \|r4N/L\| = 0.328 |
| (12) \|r4P/L\| = 0.395 |
| (13) f22/f23 = 1.16 |
| (14) (r5p − r5n)/(rsp + r5n) = 0.206 |
| (15) (r5R − r6F)/(r5R + r6F) = −0.0114 |
| (16) d56/L = 0.00698 |
| (17) d6/r6F = 0.981 |
| (18) (r5F − r5R)/(r5F + r5R) = 0.673 |
| (19) f21/L = 0.257 |
| (20) f2F/f2R = 0.593 |

TABLE 5

Third Embodiment
dO = 105.97406
β = ⅕
NA = 0.57
Bf = 21.09296
L = 1100

| | r | d | n |
|---|---|---|---|
| 1 | 835.93450 | 19.00074 | 1.61298 |
| 2 | 349.00002 | 6.60188 | |
| 3 | 493.73823 | 30.01023 | 1.61536 |
| 4 | −364.99999 | 1.12825 | |
| 5 | 189.67357 | 32.71424 | 1.61536 |
| 6 | ∞ | 1.25667 | |
| 7 | 219.68925 | 26.27974 | 1.61536 |
| 8 | −2935.50000 | 2.86486 | |
| 9 | −1456.03000 | 15.60000 | 1.61298 |
| 10 | 98.87901 | 25.83515 | |
| 11 | 572.77742 | 19.48735 | 1.48734 |
| 12 | −245.99492 | 3.28431 | |
| 13 | −517.01308 | 16.35209 | 1.61536 |
| 14 | 118.78195 | 22.95916 | |
| 15 | −151.83256 | 12.94478 | 1.61536 |
| 16 | 196.86505 | 33.74710 | |
| 17 | −129.25780 | 12.89677 | 1.61536 |
| 18 | −491.95895 | 13.46314 | |
| 19 | −246.12435 | 22.58245 | 1.61536 |
| 20 | −166.51997 | 0.39125 | |
| 21 | −1477.30500 | 28.55306 | 1.61536 |
| 22 | −216.04701 | 0.72991 | |
| 23 | 425.36937 | 33.51075 | 1.61536 |
| 24 | −524.95999 | 0.96043 | |
| 25 | 438.35798 | 25.74084 | 1.48734 |
| 26 | −1678.66000 | 0.33363 | |
| 27 | 292.51673 | 23.69782 | 1.48734 |
| 28 | 1518.72000 | 0.83738 | |
| 29 | 218.42396 | 26.38775 | 1.48734 |
| 30 | 148.35403 | 33.09868 | |
| 31 | 203.95726 | 27.76454 | 1.61536 |
| 32 | 133.43801 | 30.67100 | |
| 33 | −211.86216 | 13.01538 | 1.61298 |
| 34 | −1024.57000 | 15.53690 | |
| 35 | −160.75584 | 13.15020 | 1.61298 |
| 36 | 270.91502 | 0.55149 | |
| 37 | 250.92650 | 15.66663 | 1.48734 |
| 38 | 702.02996 | 23.07586 | |
| 39 | −827.25951 | 15.36200 | 1.61298 |
| 40 | 2298.00000 | 0.73901 | |
| 41 | 2301.62000 | 27.62162 | 1.48734 |
| 42 | −223.08205 | 0.51051 | |

TABLE 5-continued

Third Embodiment
dO = 105.97406
β = ⅕
NA = 0.57
Bf = 21.09296
L = 1100

| | r | d | n |
|---|---|---|---|
| 43 | 488.67440 | 34.23933 | 1.48734 |
| 44 | −319.00802 | 0.49298 | |
| 45 | 500.98379 | 34.15684 | 1.61536 |
| 46 | −369.12909 | 9.55181 | |
| 47 | −242.59289 | 18.84686 | 1.61298 |
| 48 | −613.52998 | 0.50392 | |
| 49 | 347.10206 | 30.00332 | 1.61536 |
| 50 | −1728.40000 | 0.49017 | |
| 51 | 180.81644 | 30.27184 | 1.48734 |
| 52 | 728.32004 | 0.48766 | |
| 53 | 119.02258 | 38.20547 | 1.48734 |
| 54 | 609.84003 | 3.61782 | |
| 55 | 1650.31000 | 19.05217 | 1.61298 |
| 56 | 77.86795 | 17.17240 | |
| 57 | 81.07073 | 30.61882 | 1.48734 |
| 58 | −335.26499 | 2.16189 | |
| 59 | −316.96290 | 26.15191 | 1.61536 |
| 60 | −848.55009 | (Bf) | |

TABLE 6

| Correspondent Values to the Conditions for Third Embodiment |
|---|
| (1) f1/L = 0.117 |
| (2) f2/L = −0.0288 |
| (3) f3/L = 0.106 |
| (4) f4/L = −0.0762 |
| (5) f5/L = 0.0868 |
| (6) f6/L = 0.147 |
| (7) I/L = 2.87 |
| (8) f4A/f4B = 2.69 |
| (9) (r2Ff − r2Fr)/(r2Ff + r2Fr) = 1.15 |
| (10) (r4N − r4P)/(r4N + r4P) = 0.0383 |
| (11) \|r4N/L\| = 0.246 |
| (12) \|r4P/L\| = 0.228 |
| (13) f22/f23 = 1.13 |
| (14) (r5p − r5n)/(r5p + r5n) = 0.207 |
| (15) (r5R − r6F)/(r5R + r6F) = −0.0202 |
| (16) d56/L = 0.00156 |
| (17) d6/r6F = 0.987 |
| (18) (r5F − r5R)/(r5F + r5R) = 0.910 |
| (19) f21/L = 0.324 |
| (20) f2F/f2R = 0.521 |

TABLE 7

Fourth Embodiment
dO = 83.70761
β = ⅕
NA = 0.57
Bf = 21.09296
L = 1100

| | r | d | n |
|---|---|---|---|
| 1 | 1185.70800 | 19.00074 | 1.61298 |
| 2 | 477.18400 | 6.60188 | |
| 3 | 1060.88800 | 30.01023 | 1.61536 |
| 4 | −338.64042 | 1.12825 | |
| 5 | 200.00000 | 32.71424 | 1.61536 |
| 6 | −2276.77900 | 1.25667 | |
| 7 | 248.82758 | 26.27974 | 1.61536 |
| 8 | −1078.61200 | 3.19741 | |
| 9 | −726.49629 | 15.60000 | 1.61298 |

TABLE 7-continued

Fourth Embodiment
dO = 83.70761
β = ⅕
NA = 0.57
Bf = 21.09296
L = 1100

| | r | d | n |
|---|---|---|---|
| 10 | 110.53957 | 25.83515 | |
| 11 | 2000.00000 | 19.48735 | 1.48734 |
| 12 | −236.03800 | 3.28431 | |
| 13 | −3000.00000 | 16.35209 | 1.61536 |
| 14 | 109.86653 | 32.21675 | |
| 15 | −153.78948 | 12.94478 | 1.61536 |
| 16 | 226.94451 | 35.22505 | |
| 17 | −132.31662 | 12.89677 | 1.61536 |
| 18 | −830.43817 | 15.00000 | |
| 19 | −330.52996 | 22.58245 | 1.61536 |
| 20 | −184.59786 | 0.39125 | |
| 21 | −1874.03800 | 28.55306 | 1.61536 |
| 22 | −221.73570 | 0.72991 | |
| 23 | 558.10318 | 33.51075 | 1.61536 |
| 24 | −552.83568 | 0.96043 | |
| 25 | 478.84376 | 25.74084 | 1.48734 |
| 26 | −906.26315 | 0.33363 | |
| 27 | 287.03514 | 23.69782 | 1.48734 |
| 28 | 2359.17900 | 0.83738 | |
| 29 | 201.46068 | 26.38775 | 1.48734 |
| 30 | 155.19710 | 46.91024 | |
| 31 | 198.66962 | 27.76454 | 1.61536 |
| 32 | 122.40099 | 26.77778 | |
| 33 | −220.19752 | 13.01538 | 1.61298 |
| 34 | 3835.74700 | 12.87579 | |
| 35 | −180.57897 | 13.15020 | 1.61298 |
| 36 | 270.91501 | 0.55149 | |
| 37 | 250.92650 | 15.66663 | 1.48734 |
| 38 | 702.02997 | 25.47244 | |
| 39 | −1387.52600 | 15.36200 | 1.61298 |
| 40 | 404.60733 | 0.73901 | |
| 41 | 437.56885 | 27.62162 | 1.48734 |
| 42 | −242.82524 | 0.51051 | |
| 43 | 476.89455 | 34.23933 | 1.48734 |
| 44 | −364.55546 | 0.49298 | |
| 45 | 500.11721 | 34.15684 | 1.61536 |
| 46 | −381.64661 | 9.55181 | |
| 47 | −243.22857 | 18.84686 | 1.61298 |
| 48 | −378.77918 | 0.50392 | |
| 49 | 355.95061 | 30.00332 | 1.61536 |
| 50 | 6474.81200 | 0.49017 | |
| 51 | 171.50098 | 30.27184 | 1.48734 |
| 52 | 722.00626 | 0.48766 | |
| 53 | 113.44841 | 38.20547 | 1.48734 |
| 54 | 442.83450 | 3.61782 | |
| 55 | 730.67537 | 19.05217 | 1.61298 |
| 56 | 73.59136 | 17.17240 | |
| 57 | 78.92998 | 30.61882 | 1.48734 |
| 58 | −315.11137 | 2.16189 | |
| 59 | −286.11801 | 26.15191 | 1.61536 |
| 60 | −878.71576 | (Bf) | |

TABLE 8

Correspondent Values to the Conditions for Fourth Embodiment (1) f1/L = 0.119
(2) f2/L = −0.0278
(3) f3/L = 0.106
(4) f4/L = −0.0675
(5) f5/L = 0.0805
(6) f6/L = 0.146
(7) I/L = 2.29
(8) f4A/f4B = 1.94
(9) (r2Ff − r2Fr)/(r2Ff + r2Fr) = 1.36
(10) (r4N − r4P)/(r4N + r4P) = 0.0383

TABLE 8-continued

Correspondent Values to the Conditions for Fourth Embodiment

(11) |r4N/L| = 0.246
(12) |r4P/L| = 0.228
(13) f22/f23 = 1.17
(14) (r5p − r5n)/(r5p + r5n) = 0.222
(15) (r5R − r6F)/(r5R + r6F) = −0.0350
(16) d56/L = 0.00156
(17) d6/r6F = 1.01
(18) (r5F − r5R)/(r5F + r5R) = 0.817
(19) f21/L = 0.395
(20) f2F/f2R = 0.603

Letting L be the distance (object-to-image distance) from the object plane P1 (reticle plane) to the image plane P2 (wafer plane) and Φ be a refractive power of lens surface in the sixth lens group $G_6$, in the first embodiment as described previously, $1/|\Phi L|=0.130$ for the object-side lens surface of the positive lens $L_{61}$ and $1/|\Phi L|=0.532$ for the object-side lens surface of the negative lens $L_{62}$, thus satisfying the condition (21). In the second embodiment, $1/|\Phi L|=0.130$ for the object-side lens surface of the positive lens $L_{61}$ and $1/|\Phi L|=0.550$ for the object-side lens surface of the negative lens $L_{62}$, thus satisfying the condition (21). In the third embodiment, $1/|\Phi L|=0.151$ for the object-side lens surface of the positive lens $L_{61}$ and $1/|\Phi L|=0.468$ for the object-side lens surface of the negative lens $L_{62}$, thus satisfying the condition (21). In the fourth embodiment, $1/|\Phi L|=0.147$ for the object-side lens surface of the positive lens $L_{61}$ and $1/|\Phi L|=0.423$ for the object-side lens surface of the negative lens $L_{62}$, thus satisfying the condition (21).

As described above, the sixth lens group $G_6$ in each embodiment is composed of three or less lenses including the lens surfaces satisfying the condition (21).

It is understood from the above values of specifications for the respective embodiments that the projection optical systems according to the embodiments achieved satisfactory telecentricity on the object side (reticle R side) and on the image side (wafer W side) as securing the large numerical apertures and wide exposure areas.

FIG. 7 to FIG. 22 are respectively aberration diagrams to show aberrations in the first to fourth embodiments. Each of FIGS. 7, 11, 15, and 19 shows a spherical aberration of each embodiment. Each of FIGS. 8, 12, 16, and 20 shows an astigmatism of each embodiment. Each of FIGS. 9, 13, 17, and 21 shows a distortion of each embodiment. Each of FIGS. 10, 14, 18, and 22 shows a coma of each embodiment.

Here, in each aberration diagram, NA represents the numerical aperture of the projection optical system 1, and Y the image height, and in each astigmatism diagram, the dashed line represents the meridional image surface and the solid line the sagittal image surface.

It is understood from comparison of the aberation diagrams that the aberrations are corrected in a good balance in each embodiment even with a wide exposure area (image height) and a large numerical aperture, particularly, distortion is extremely well corrected up to nearly zero throughout the entire image, thus achieving the projection optical system with high resolving power in a wide exposure area.

The above-described embodiments showed the examples using the mercury lamp as a light source for supplying the exposure light of the i-line (365 nm), but it is needless to mention that the invention is not limited to the examples; for example, the invention may employ light sources including a mercury lamp supplying the exposure light of the g-line (435 nm), and extreme ultraviolet light sources such as excimer lasers supplying light of 193 nm or 248 nm.

In the above each embodiment the lenses constituting the projection optical system are not cemented to each other, which can avoid a problem of a change of cemented surfaces with time. Although in the above each embodiment the lenses constituting the projection optical system are made of a plurality of optic materials, they may be made of a single glass material, for example quartz ($SiO_2$) if the wavelength region of the light source is not a wide band.

As described above, the projection optical system according to the present invention can achieve the bitelecentricity in a compact design as securing a wide exposure area and a large numerical aperture, and the invention can achieve the projection optical system with high resolving power corrected in a good balance for aberrations, particularly extremely well corrected for distortion.

From the invention thus described, it will be obvious that the invention may be varied in many ways. Such variations are not to be regarded as a departure from the spirit and scope of the invention, and all such modifications as would be obvious to one skilled in the art are intended to be included within the scope of the following claims. The basic Japanese Application No. 872/1995 filed on Jan. 6, 1995 is hereby incorporated by reference.

What is claimed is:

1. A projection optical system provided between a first object and a second object, for projecting an image of a first object onto a second object, said projection optical system comprising a first lens group with a positive refracting power, a second lens group with a negative refracting power, a third lens group with a positive refracting power, a fourth lens group with a negative refracting power, a fifth lens group with a positive refracting power, and a sixth lens group with a positive refracting power in order from the side of said first object, wherein said second lens group comprises a front lens with a negative refracting power disposed as closest to said first object and shaped with a concave surface to said second object, a rear lens of a negative meniscus shape disposed as closest to said second object and shaped with a concave surface to said first object, and an intermediate lens group disposed between said front lens and said rear lens, said intermediate lens group having a first lens with a positive refracting power, a second lens with a negative refracting power, and a third lens with a negative refracting power in order from the side of said first object, and wherein when $f_1$ is a focal length of said first lens group, $f_2$ is a focal length of said second lens group, $f_3$ is a focal length of said third lens group, $f_4$ is a focal length of said fourth lens group, $f_5$ is a focal length of said fifth lens group, $f_6$ is a focal length of said sixth lens group, and L is a distance from said first object to said second object, the following conditions are satisfied:

$$f_1/L<0.8$$

$$-0.033<f_2/L$$

$$0.01<f_3/L<1.0$$

$$f_4/L<-0.005$$

$$0.01<f_5/L<0.9$$

$$0.02<f_6/L<1.6.$$

2. A projection optical system according to claim 1, wherein when I is an axial distance from said first object to a first-object-side focal point of said entire projection optical system and L is the distance from said first object to said second object, the following condition is satisfied:

$$1.0<I/L.$$

3. A projection optical system according to claim 1, wherein said fourth lens group comprises:

a front lens group disposed as closest to the first object, said front lens group having two negative meniscus lenses each shaped with a concave surface to said second object;

a rear lens disposed as closest to the second object, said rear lens group having a negative lens with a concave surface to said first object; and an intermediate lens group disposed between said front lens group in said fourth lens group and said rear lens group in said fourth lens group, said intermediate lens group having first and second negative lenses in order from the side of said first object, and wherein when $f_{4A}$ is a focal length of said first negative lens in said fourth lens group and $f_{4B}$ is a focal length of said second negative lens in said fourth lens group, the following condition is satisfied:

$$0.05<f_{4A}/f_{4B}<20.$$

4. A projection optical system according to claim 1, wherein when $r_{2Ff}$ is a radius of curvature of a first-object-side surface of said front lens and $r_{2Fr}$ is a radius of curvature of a second-object-side surface of said front lens, the front lens in said second lens group satisfies the following condition:

$$1.00\leqq(r_{2Ff}-r_{2Fr})/(r_{2Ff}+r_{2Fr})<5.0.$$

5. A projection optical system according to claim 1, wherein said fourth lens group has:

a front lens group having a negative lens disposed as closest to said first object and shaped with a concave surface to said second object;

a rear lens group having a negative lens disposed as closest to the second object and shaped with a concave surface to said first object; and an intermediate lens group having a negative lens and a positive lens with a convex surface adjacent to a concave surface of said negative lens is disposed between said front lens group in said fourth lens group and said rear lens group in said fourth lens group, and wherein when $r_{4N}$ is a radius of curvature of said concave surface of the negative lens in said intermediate lens group and $r_{4P}$ is a radius of curvature of said convex surface of the positive lens in said intermediate lens group, the following condition is satisfied:

$$-0.9<(r_{4N}-r_{4P})/(r_{rN}+r_{4P})<0.9,$$

provided that when L is the distance from said first object to said second object, said concave surface of said negative lens in said intermediate lens group or said convex surface of said positive lens in said intermediate lens group satisfies at least one of the following conditions:

$$|r_{4N}/L|<2.0$$

$$|r_{4P}/L|<2.0.$$

6. A projection optical system according to claim 1, wherein when $f_{22}$ is a focal length of the second lens with the negative refracting power in said second lens group and $f_{23}$ is a focal length of the third lens with the negative refracting power in said second lens group, the following condition is satisfied:

$$0.1<f_{22}/f_{23}<10.$$

7. A projection optical system according to claim 1, wherein said fifth lens group has a negative meniscus lens, and a positive lens disposed as adjacent to a concave surface of said negative meniscus lens and having a convex surface opposed to the concave surface of said negative meniscus lens, and wherein when $r_{5n}$ is a radius of curvature of the concave surface of said negative meniscus lens in said fifth lens group and $r_{5P}$ is a radius of curvature of the convex surface, opposed to the concave surface of the negative meniscus lens, of the positive lens disposed as adjacent to the concave surface of said negative meniscus lens in said fifth lens group, the following condition is satisfied:

$$0<(r_{5P}-r_{5n})/(r_{5P}+r_{5n})<1.$$

8. A projection optical system according to claim 7, wherein said negative meniscus lens and said positive lens adjacent to the concave surface of said negative meniscus lens are disposed between at least one positive lens in said fifth lens group and at least one positive lens in said fifth lens group.

9. A projection optical system according to claim 1, wherein said fifth lens group has a negative lens disposed as closest to the second object and shaped with a concave surface to the second object and the sixth lens group has a lens disposed as closest to the first object and shaped with a convex surface to the first object, and wherein when $r_{5R}$ is a radius of curvature of a second-object-side surface of the negative lens disposed as closest to the second object in said fifth lens group and $r_{6F}$ is a radius of curvature of a first-object-side surface of the lens disposed as closest to the first object in said sixth lens group, the following condition is satisfied:

$$-0.90<(r_{5R}-r_{6F})/(r_{5R}+r_{5F})<-0.001.$$

10. A projection optical system according to claim 1, wherein when $d_{56}$ is a lens group separation between said fifth lens group and said sixth lens group and L is the distance from said first object to said second object, the following condition is satisfied:

$$d_{56}/L<0.017.$$

11. A projection optical system according to claim 1, wherein when $r_{6F}$ is a radius of curvature of a lens surface closest to the first object in said sixth lens group and $d_6$ is an axial distance from the lens surface closest to the first object in said sixth lens group to the second object, the following condition is satisfied:

$$0.50<d_6/r_{6F}<1.50.$$

12. A projection optical system according to claim 1, wherein said fifth lens group has a negative lens disposed as closest to the second object and shaped with a concave surface to the second object, and wherein when $r_{5F}$ is a radius of curvature of a first-object-side surface of the negative lens disposed as closest to the second object in said fifth lens group and $r_{5R}$ is a radius of curvature of a second-object-side surface of the negative lens disposed as closest to the second object in said fifth lens group, the following condition is satisfied:

$$0.30<(r_{5F}-r_{5R})/(r_{5F}+r_{5R})<1.28.$$

13. A projection optical system according to claim 1, wherein when $f_2$ is a focal length of the first lens with the positive refracting power in the intermediate lens group in said second lens group and L is the distance from said first object to said second object, the following condition is satisfied:

$$0.230<f_{21}/L<0.40.$$

14. A projection optical system according to claim 1, wherein when $f_{2F}$ is a focal length of the front lens with the negative refracting power disposed as closest to the first object in said second lens group and shaped with the concave surface to said second object and $f_{2R}$ is a focal length of the rear lens with the negative refracting power disposed as closest to the second object in said second lens group and shaped with the concave surface to said first object, the following condition is satisfied:

$$0<f_{2F}/f_{2R}<18.$$

15. A projection optical system according to claim 1, wherein the intermediate lens group in said second lens group has a negative refracting power.

16. A projection optical system according to claim 1, wherein said first lens group has at least two positive lenses, said third lens group has at least three positive lenses, said fourth lens group has at least three negative lenses, said fifth lens group has at least five positive lenses and at least one negative lens, and said sixth lens group has at least one positive lens.

17. A projection optical system according to claim 1, wherein said sixth lens group comprises three or less lenses having at least one lens surface satisfying the following condition:

$$1/|\phi L|<20$$

where $\phi$: a refractive power of said lens surface, and L: the object-to-image distance from said first object to said second object.

18. A projection optical system according to claim 1, wherein a magnification of said projection optical system is ⅕.

19. A method for manufacturing integrated circuits, said method including an exposure process of projecting an image of a pattern on a mask onto a photosensitive substrate with an exposure light of a predetermined wavelength, said exposure process comprising the steps of:

supplying said exposure light;

introducing said exposure light to said mask;

making said exposure light passing through said mask incident on a projection optical system according to claim 1; and introducing said exposure light passing through said projection optical system onto said photosensitive substrate.

20. A projection optical system according to claim 1, wherein said fifth lens group comprises a negative lens placed as closet to the second object and having a concave surface opposed to the second object.

21. A projection optical system according to claim 20, wherein when $d_{56}$ is a lens group separation between said fifth lens group and said sixth lens group and L is the distance from said first object to said second object, the following condition is satisfied:

$$d_{56}/L<0.017.$$

22. A projection optical system according to claim 20, wherein when $r_{6F}$ is a radius of curvature of a lens surface closest to the first object in said sixth lens group and $d_6$ is an axial distance from the lens surface closest to the first object in said sixth lens group to the second object, the following condition is satisfied:

$$0.50<d_6/r_{6F}<1.50.$$

23. A projection optical system according to claim 20, wherein said sixth lens group comprises three or less lenses having at least one lens surface satisfying the following condition:

$$1/|\phi L|<20$$

where $\phi$: a refractive power of said lens surface, and

L: the object-to-image distance from said first object to said second object.

24. A projection optical system according to claim 16, wherein when I is an axial distance from said first object to a first-object-side focal point of said entire projection optical system and L is the distance from said first object to said second object, the following condition is satisfied:

$$1.0<I/L.$$

25. A projection optical system according to claim 24, wherein said fifth lens group has a negative meniscus lens, and a positive lens disposed as adjacent to a concave surface of said negative meniscus lens and having a convex surface opposed to the concave surface of said negative meniscus lens, and wherein when $r_{5n}$ is a radius of curvature of the concave surface of said negative meniscus lens in said fifth lens group and $r_{5P}$ is a radius of curvature of the convex surface, opposed to the concave surface of the negative meniscus lens, of the positive lens disposed as adjacent to the concave surface of said negative meniscus lens in said fifth lens group, the following condition is satisfied:

$$0<(r_{5p}-r_{5n})/(r_{5p}+r_{5n})<1.$$

26. A projection optical system according to claim 25, wherein said negative meniscus lens and said positive lens adjacent to the concave surface of said negative meniscus lens are disposed between at least one positive lens in said fifth lens group and at least one positive lens in said fifth lens group.

27. A projection optical system according to claim 26, wherein said fifth lens group comprises a negative lens placed as closest to the second object and having a concave surface opposed to the second object.

28. A projection optical system according to claim 27, wherein when $r_{6F}$ is a radius of curvature of a lens surface closest to the first object in said sixth lens group and $d_6$ is an axial distance from the lens surface closest to the first object in said sixth lens group to the second object, the following condition is satisfied:

$$0.50<d_6/r_{6F}<1.50.$$

29. A projection optical system according to claim 28, wherein when $f_{22}$ is a focal length of the second lens with the negative refracting power in said second lens group and $f_{23}$ is a focal length of the third lens with the negative refracting power in said second lens group, the following condition is satisfied:

$$0.1<f_{22}/f_{23}<10.$$

30. A projection optical system according to claim 29, wherein when $f_{21}$ is a focal length of the first lens with the positive refracting power in the intermediate lens group in said second lens group and L is the distance from said first object to said second object, the following condition is satisfied:

$$0.230<f_{21}/L<0.40.$$

31. A method for manufacturing integrated circuits, said method including an exposure process of projecting an image of a pattern on a mask onto a photosensitive substrate with an exposure light of a predetermined wavelength, said exposure process comprising the steps of:

supplying said exposure light;

introducing said exposure light to said mask;

making said exposure light passing through said mask incident on a projection optical system according to claim 30; and introducing said exposure light passing through said projection optical system onto said photosensitive substrate.

32. A method for manufacturing integrated circuits, said method including an exposure process of projecting an image of a pattern on a mask onto a photosensitive substrate with an exposure light of a predetermined wavelength, said exposure process comprising the steps of:

supplying said exposure light;

introducing said exposure light to said mask;

making said exposure light passing through said mask incident on a projection optical system according to claim 28; and introducing said exposure light passing through said projection optical system onto said photosensitive substrate.

33. A projection optical system according to claim 24, wherein said fourth lens group comprises:

a front lens group disposed as closest to the first object, said front lens group having two negative meniscus lenses each shaped with a concave surface to said second object;

a rear lens group disposed as closest to the second object, said rear lens group having a negative lens with a concave surface to said first object; and an intermediate lens group disposed between said front lens group in said fourth lens group and said rear lens group in said fourth lens group, said intermediate lens group having first and second negative lenses in order from the side of said first object, and wherein when $f_{4A}$ is a focal length of said first negative lens in said fourth lens group and $f_{4B}$ is a focal length of said second negative lens in said fourth lens group, the following condition is satisfied:

$$0.05<f_{4A}/f_{4B}<20.$$

34. A projection optical system according to claim 24, wherein when $r_{Ff}$ is a radius of curvature of a first-object-side surface of said front lens and $r_{Fr}$ is a radius of curvature of a second-object-side surface of said front lens, the front lens in said second lens group satisfies the following condition:

$$1.00<(r_{2Ff}-r_{2Fr})/(r_{2Ff}+r_{2Fr})<5.0$$

35. A projection optical system according to claim 24, wherein said fourth lens group has:

a front lens group having a negative lens disposed as closest to said first object and shaped with a concave surface to said second object;

a rear lens group having a negative lens disposed as closest to the second object and shaped with a concave surface to said first object; and an intermediate lens group having a negative lens and a positive lens with a convex surface adjacent to a concave surface of said negative lens is disposed between said front lens group in said fourth lens group and said rear lens group in said fourth lens group, and wherein when $r_{4N}$ is a radius of curvature of said concave surface of the negative lens in said intermediate lens group and $r_{4P}$ is a radius of curvature of said convex surface of the positive lens in said intermediate lens group, the following condition is satisfied:

$$-0.9<(r_{4N}-r_{4P})/(r_{4N}+r_{4P})<0.9,$$

provided that when L is the distance from said first object to said second object, said concave surface of said negative lens in said intermediate lens group or said convex surface of said positive lens in said intermediate lens group satisfies at least one of the following conditions:

$$|r_{4N}/L|<2.0$$

$$|r_{4P}/L|<2.0.$$

36. A projection optical system according to claim 24, wherein said fifth lens group comprises a negative lens placed as closest to the second object and having a concave surface opposed to the second object.

37. A projection optical system according to claim 36, wherein when $r_{6F}$ is a radius of curvature of a lens surface closest to the first object in said sixth lens group and $d_6$ is an axial distance from the lens surface closest to the first object in said sixth lens group to the second object, the following condition is satisfied:

$$0.50<d_6/r_{6F}<1.50.$$

38. A projection optical system according to claim 37, wherein when $f_{22}$ s a focal length of the second lens with the negative refracting power in said second lens group and $f_{23}$ is a focal length of the third lens with the negative refracting power in said second lens group, the following condition is satisfied:

$$0.1<f_{22}/f_{23}<10.$$

39. A projection optical system according to claim 38, wherein when $f_{21}$ is a focal length of the first lens with the positive refracting power in the intermediate lens group in said second lens group and L is the distance from said first object to said second object, the following condition is satisfied:

$$0.230<f_{21}/L<0.40.$$

40. A method for manufacturing integrated circuits, said method including an exposure process of projecting an image of a pattern on a mask onto a photosensitive substrate with an exposure light of a predetermined wavelength, said exposure process comprising the steps of:

supplying said exposure light;

introducing said exposure light to said mask;

making said exposure light passing through said mask incident on a projection optical system according to claim 39; and introducing said exposure light passing through said projection optical system onto said photosensitive substrate.

41. A projection optical system according to claim 24, wherein when $f_{22}$, is a focal length of the second lens with the negative refracting power in said second lens group and $f_{23}$ is a focal length of the third lens with the negative refracting power in said second lens group, the following condition is satisfied:

$$0.1<f_{22}/f_{23}<10.$$

42. A projection optical system according to claim 41, wherein when $f_{21}$ is a focal length of the first lens with the positive refracting power in the intermediate lens group in said second lens group and L is the distance from said first object to said second object, the following condition is satisfied:

$$0.230<f_{21}/L<0.40.$$

43. A projection optical system according to claim 24, wherein when $f_{21}$ is a focal length of the first lens with the positive refracting power in the intermediate lens group in said second lens group and L is the distance from said first object to said second object, the following condition is satisfied:

$$0.230<f_{21}/L<0.40.$$

44. A method for manufacturing integrated circuits, said method including an exposure process of projecting an image of a pattern on a mask onto a photosensitive substrate with an exposure light of a predetermined wavelength, said exposure process comprising the steps of:

supplying said exposure light;

introducing said exposure light to said mask;

making said exposure light passing through said mask incident on a projection optical system according to claim 24; and introducing said exposure light passing through said projection optical system onto said photosensitive substrate.

45. A projection optical system according to claim 16, wherein said fifth lens group has a negative meniscus lens, and a positive lens disposed as adjacent to a concave surface of said negative meniscus lens and having a convex surface opposed to the concave surface of said negative meniscus lens, and wherein when $r_{5n}$ is a radius of curvature of the concave surface of said negative meniscus lens in said fifth lens group and $r_{5P}$ is a radius of curvature of the convex surface, opposed to the concave surface of the negative meniscus lens, of the positive lens disposed as adjacent to the concave surface of said negative meniscus lens in said fifth lens group, the following condition is satisfied:

$$0<(r_{5p}-r_{5n})/(r_{5p}+r_{5n})<1.$$

46. A projection optical system according to claim 45, wherein said negative meniscus lens and said positive lens adjacent to the concave surface of said negative meniscus lens are disposed between at least one positive lens in said fifth lens group and at least one positive lens in said fifth lens group.

47. A method for manufacturing integrated circuits, said method including an exposure process of projecting an image of a pattern on a mask onto a photosensitive substrate with an exposure light of a predetermined wavelength, said exposure process comprising the steps of:

supplying said exposure light;

introducing said exposure light to said mask;

making said exposure light passing through said mask incident on a projection optical system according to claim 46; and introducing said exposure light passing through said projection optical system onto said photosensitive substrate.

48. An exposure apparatus comprising:

a stage allowing a photosensitive substrate to be held on a main surface thereof;

an illumination optical system for emitting exposure light of a predetermined wavelength and transferring a predetermined pattern of a mask onto said substrate; and a projection optical system provided between said mask and said substrate, said projection optical system including a first lens group with a positive refracting power, a second lens group with a negative refracting power, a third lens group with a positive refracting power, a fourth lens group with a negative refracting power, a fifth lens group with a positive refracting power, and a sixth lens group with a positive refracting power in order from the side of said mask, wherein said second lens group comprises a front lens with a negative refracting power disposed as closest to said first object and shaped with a concave surface to said second object, a rear lens of a negative meniscus shape disposed as closest to said second object and shaped with a concave surface to said mask, and an intermediate lens group disposed between said front lens and said rear lens, said intermediate lens group having a first lens with a positive refracting power, a second lens with a negative refracting power, and a third lens with a negative refracting power in order from the side of said mask, and wherein when $f_1$ is a focal length of said first lens group, $f_2$ is a focal length of said second lens group, $f_3$ is a focal length of said third lens group, $f_4$ is a focal length of said fourth lens group, $f_5$ is a focal length of said fifth lens group, $f_6$ is a focal length of said sixth lens group, and L is a distance from said mask to said substrate, the following conditions are satisfied:

$$f_1/L<0.8$$

$$-0.033<f_2/L$$

$$0.01<f_3/L<1.0$$

$$f_4/L<-0.005$$

$$0.01<f_5/L<0.9$$

$$0.02<f_6/L<1.6.$$

49. An exposure apparatus according to claim 48, wherein a magnification of said projection optical system is ⅕.

50. An exposure apparatus according to claim 48, wherein said first lens group has at least two positive lenses, said third lens group has at least three positive lenses, said fourth lens group has at least three negative lenses, said fifth lens group has at least five positive lenses and at least one negative lens, and said sixth lens group has at least one positive lens.

51. An exposure apparatus according to claim 50, wherein when I is an axial distance from said first object to a first-object-side focal point of said entire projection optical system and L is the distance from said first object to said second object, the following condition is satisfied:

$$1.0<I/L.$$

52. An exposure apparatus according to claim 51, wherein said fifth lens group has a negative meniscus lens, and a positive lens disposed as adjacent to a concave surface of said negative meniscus lens and having a convex surface opposed to the concave surface of said negative meniscus lens, and wherein when $r_{5n}$ is a radius of curvature of the concave surface of said negative meniscus lens in said fifth lens group and $r_{5P}$ is a radius of curvature of the convex surface, opposed to the concave surface of the negative meniscus lens, of the positive lens disposed as adjacent to the concave surface of said negative meniscus lens in said fifth lens group, the following condition is satisfied:

$$0<(r_{5p}-r_{5n})/(r_{5P}+r_{5n})<1.$$

53. An exposure apparatus according to claim 52, wherein said negative meniscus lens and said positive lens adjacent to the concave surface of said negative meniscus lens are disposed between at least one positive lens in said fifth lens group and at least one positive lens in said fifth lens group.

54. An exposure apparatus according to claim 51, wherein said fifth lens group comprises a negative lens placed as closest to the second object and having a concave surface opposed to the second object.

55. An exposure apparatus according to claim 54, wherein when $r_{6F}$ is a radius of curvature of a lens surface closest to the first object in said sixth lens group and $d_6$ is an axial distance from the lens surface closest to the first object in said sixth lens group to the second object, the following condition is satisfied:

$$0.50<d_6/r_{6F}<1.50.$$

56. An exposure apparatus according to claim 51, wherein when $f_{22}$ is focal length of the second lens with the negative refracting power in said second lens group and $f_{23}$ is a focal length of the third lens with the negative refracting power in said second lens group, the following condition is satisfied:

$$0.1<f_{22}/f_{23}<10.$$

57. An exposure apparatus according to claim 51, wherein when $f_{21}$ is a focal length of the first lens with the positive refracting power in the intermediate lens group in said second lens group and L is the distance from said first object to said second object, the following condition is satisfied:

$$0.230<f_{21}/L<0.40.$$

*58. A projection optical system for projecting a reduced image of a first surface onto a second surface, comprising:*

*a first lens group with a positive refracting power arranged in an optical path between the first surface and the second surface;*

*a second lens group with a negative refracting power arranged in an optical path between said first positive lens group and the second surface;*

*a third lens group with a positive refracting power arranged in an optical path between said second lens group and the second surface; and*

*additional lens groups arranged in an optical path between said third lens group and the second surface and comprising*

*a first pair of lenses,*

*a second pair of lenses, and*

*an aperture stop located between the first and second pairs of lenses,*

*wherein at least one of the first and second pairs of lenses comprises a negative lens.*

*59. The projection optical system according to claim 58, wherein at least one of the first and second pairs of lenses has a negative refractive power.*

*60. The projection optical system according to claim 59, wherein the negative lens in said additional lens groups is juxtaposed to the aperture stop.*

*61. The projection optical system according to claim 60, further comprising a meniscus-shaped space juxtaposed to the negative lens in said additional lens groups.*

*62. The projection optical system according to claim 58, wherein the negative lens in said additional lens groups is juxtaposed to the aperture stop.*

*63. The projection optical system according to claim 62, further comprising a meniscus-shaped space juxtaposed to the negative lens in said additional lens groups.*

*64. The projection optical system according to claim 58, further comprising a space juxtaposed to the negative lens in said additional lens groups and having a shape with an on-axis distance along an optical axis longer than a peripheral distance along a direction parallel to the optical axis.*

*65. The projection optical system according to claim 64, wherein said space comprises a meniscus shape.*

*66. The projection optical system according to claim 64, wherein said space is arranged in an optical path between said third lens group and the aperture stop.*

*67. The projection optical system according to claim 58, wherein*

*the first pair of lenses comprises a space juxtaposed to the negative lens in said additional lens groups and having a shape with an on-axis distance along an optical axis longer than a peripheral distance along a direction parallel to the optical axis, and*

*the second pair of lenses comprises a space juxtaposed to the negative lens in said additional lens groups and comprising a shape with an on-axis distance along an optical axis longer than a peripheral distance along a direction parallel to the optical axis.*

*68. The projection optical system according to claim 58, wherein each of the lenses in the projection optical system consists of a non-cemented lens.*

*69. The projection optical system according to claim 58, wherein said third lens group comprises three positive lenses.*

*70. The projection optical system according to claim 58, wherein the projection optical system is a bitelecentric optical system.*

*71. The projection optical system according to claim 58, wherein said first lens group comprises a negative lens disposed at a side closest to the first surface.*

*72. The projection optical system according to claim 58, wherein said additional lens groups further comprise a lens group with a positive refractive power.*

*73. The projection optical system according to claim 58, wherein each of said lenses in the projection optical system comprises a single glass material.*

*74. The projection optical system according to claim 73, wherein the single glass material comprises $SiO_2$.*

*75. The projection optical system according to claim 58, wherein each of said lenses in the projection optical system comprises a plurality of optical materials.*

*76. The projection optical system according to claim 58, wherein the first pair of lenses comprises a negative lens, and the second pair of lenses comprises a negative lens.*

*77. The projection optical system according to claim 58, wherein at least one of the first and second pairs of lenses comprises a positive lens and a negative lens.*

*78. The projection optical system according to claim 58, wherein the first and second pairs of lenses comprise a positive lens and a negative lens, respectively.*

*79. The projection optical system according to claim 58, wherein said additional lens groups further comprise*

*a fourth lens group arranged in an optical path between said third lens group and the second surface,*

*a fifth lens group arranged in an optical path between the fourth lens group and the second surface, and*

*a sixth lens group arranged in an optical path between the fifth lens group and the second surface.*

*80. The projection optical system according to claim 79, wherein*

*said first lens group comprises two positive lenses,*

*said third lens group comprises three positive lenses,*

*the fourth lens group comprises three negative lenses,*

*the fifth lens group comprises five positive lenses and a negative lens, and*

*the sixth lens group comprises a positive lens.*

*81. The projection optical system according to claim 58, wherein said first lens group comprises two positive lenses, and said third lens group comprises three positive lenses.*

*82. An exposure apparatus for transferring a pattern of mask arranged on a first surface onto a workpiece arranged on a second surface, the apparatus comprising:*

*a light source to provide an exposure light of a predetermined wavelength;*

*an illumination optical system arranged in an optical path between said light source and the first surface and illuminating the mask with the exposure light; and*

*a projection optical system arranged between the first surface and the second surface and projecting a reduced image of the pattern with the exposure light onto the workpiece and comprising:*

*a first lens group with a positive refracting power arranged in an optical path between the first surface and the second surface;*

*a second lens group with a negative refracting power arranged in an optical path between the first positive lens group and the second surface;*

*a third lens group with positive refracting power arranged in an optical path between the second lens group and the second surface; and*

*additional lens groups arranged in an optical path between the third lens group and the second surface and comprising a first pair of lenses, a second pair of lenses, and an aperture stop located between the first and second pairs of lenses, wherein the at least one of the first and second pairs of lenses comprises a negative lens.*

*83. The exposure apparatus according to claim 82, wherein each of the lenses in said projection optical system consists of a non-cemented lens.*

*84. The exposure apparatus according to claim 82, wherein said projection optical system is a bitelecentric optical system.*

*85. A method for manufacturing integrated circuits, the method including an exposure process of projecting an image of a pattern on a mask onto a photosensitive substrate with an exposure light of a predetermined wavelength, the exposure process comprising:*

*supplying the exposure light;*

*introducing the exposure light to the mask;*

*passing the exposure light through the mask incident on a projection optical system according to claim 58; and*

*introducing the exposure light passing through the projection optical system onto the photosensitive substrate.*

*86. The method according to claim 85, wherein the light introduced onto the photosensitive substrate through the projection optical system does not pass through a cemented lens.*

*87. The method according to claim 85, wherein the projection optical system is a both-side-telecentric optical system.*

*88. An imaging method for imaging an image of a first surface onto a second surface, comprising:*

*introducing a light beam toward a first lens group with positive refracting power;*

*introducing the light beam from the first lens group toward a second lens group with negative refractive power;*

*introducing the light beam from the second lens group toward a third lens group with positive refractive power; and*

*introducing the light beam from the third lens group toward an additional lens groups comprising a first pair of lenses, a second pair of lenses, and an aperture stop located between the first and second pairs of lenses;*

*wherein at least one of the first and second pairs of lenses comprises a negative lens.*

*89. The method according to claim 88, wherein the light does not pass through a cemented lens.*

*90. The method according to claim 88, wherein the lenses defines an optical system that is a both-side-telecentric optical system.*

* * * * *